(12) United States Patent
Matsuo et al.

(10) Patent No.: US 12,666,567 B2
(45) Date of Patent: \*Jun. 23, 2026

(54) COOLING LIQUID CIRCULATION UNIT, METHOD FOR CONTROLLING SAME, AND PROGRAM

(71) Applicant: MITSUBISHI HEAVY INDUSTRIES, LTD., Tokyo (JP)

(72) Inventors: Minoru Matsuo, Tokyo (JP); Naohiko Matsuda, Tokyo (JP); Shinnosuke Osafune, Tokyo (JP); Fumito Kajitani, Tokyo (JP)

(73) Assignee: MITSUBISHI HEAVY INDUSTRIES, LTD., Tokyo (JP)

( \* ) Notice: Subject to any disclaimer, the term of this patent is extended or adjusted under 35 U.S.C. 154(b) by 246 days.

This patent is subject to a terminal disclaimer.

(21) Appl. No.: 18/570,362

(22) PCT Filed: Feb. 24, 2022

(86) PCT No.: PCT/JP2022/007654
§ 371 (c)(1),
(2) Date: Dec. 14, 2023

(87) PCT Pub. No.: WO2022/264530
PCT Pub. Date: Dec. 22, 2022

(65) Prior Publication Data
US 2024/0389266 A1 Nov. 21, 2024

(30) Foreign Application Priority Data
Jun. 17, 2021 (JP) .................................. 2021-100664

(51) Int. Cl.
*H05K 7/20* (2006.01)

(52) U.S. Cl.
CPC ..... *H05K 7/20281* (2013.01); *H05K 7/20136* (2013.01); *H05K 7/20209* (2013.01);
(Continued)

(58) Field of Classification Search
CPC ........... H05K 7/20281; H05K 7/20136; H05K 7/20209; H05K 7/20236; H05K 7/20263;
(Continued)

(56) References Cited

U.S. PATENT DOCUMENTS

| | | | |
|---|---|---|---|
| 10,772,238 B1 | 9/2020 | Ross | |
| 2011/0132579 A1* | 6/2011 | Best .......................... | G06F 1/20 165/104.31 |

(Continued)

FOREIGN PATENT DOCUMENTS

| | | |
|---|---|---|
| CN | 206226904 U | 6/2017 |
| JP | 2007-102323 A | 4/2007 |

(Continued)

OTHER PUBLICATIONS

International Search Report issued in International Application No. PCT/JP2022/007654, dated May 17, 2022 (7 pages).
(Continued)

*Primary Examiner* — Joel M Attey
(74) *Attorney, Agent, or Firm* — Osha Bergman Watanabe & Burton LLP

(57) ABSTRACT

A cooling liquid circulation unit circulates cooling liquid in an immersion tank for immersing and cooling electronic devices in the cooling liquid and includes a flow rate adjustment part provided in a cooling liquid circulation path for circulating the cooling liquid in the immersion tank, a heat exchanger for exchanging heat between the cooling liquid and a cooling medium, the heat exchanger being provided in the cooling liquid circulation path, and a cooling liquid circulation unit controller that includes a mode selec- (Continued)

tion part for selecting any one of a plurality of cooling modes, a calculation part for calculating a necessary cooling amount based on parameters related to operation states of the electronic devices, and a cooling condition setting part for setting a target value of parameters related to the flow rate of the cooling liquid based on the selected cooling mode and the necessary cooling amount.

7 Claims, 11 Drawing Sheets

(52) U.S. Cl.
CPC ..... *H05K 7/20236* (2013.01); *H05K 7/20263* (2013.01); *H05K 7/20272* (2013.01)

(58) Field of Classification Search
CPC ............... H05K 7/20272; H05K 7/203; H05K 7/20327; H05K 7/20381
USPC ...................................................... 165/104.33
See application file for complete search history.

(56) References Cited

U.S. PATENT DOCUMENTS

| | | | |
|---|---|---|---|
| 2013/0098599 A1 | 4/2013 | Busch et al. | |
| 2016/0037685 A1 | 2/2016 | Ross | |
| 2017/0242463 A1* | 8/2017 | Matteson | ............... G05B 15/02 |
| 2017/0354066 A1 | 12/2017 | Kodama et al. | |
| 2019/0008077 A1 | 1/2019 | Ishinabe | |
| 2019/0171261 A1 | 6/2019 | Moroo | |
| 2020/0267872 A1 | 8/2020 | Harada et al. | |
| 2021/0149465 A1 | 5/2021 | Hiltner et al. | |
| 2021/0153392 A1* | 5/2021 | Gao | .................... H05K 7/20818 |
| 2022/0011835 A1* | 1/2022 | Heydari | ................. G05B 19/02 |
| 2022/0061191 A1* | 2/2022 | Shao | .......................... G06F 1/20 |
| 2022/0121254 A1* | 4/2022 | Chen | ...................... G06F 1/3221 |
| 2024/0284634 A1* | 8/2024 | Matsuo | ............. H05K 7/20272 |

FOREIGN PATENT DOCUMENTS

| | | | |
|---|---|---|---|
| JP | 2011-141055 A | 7/2011 | |
| JP | 2017-215831 A | 12/2017 | |
| JP | 6293355 B2 | 3/2018 | |
| JP | 2019-012470 A | 1/2019 | |
| JP | 2019-021766 A | 2/2019 | |
| JP | 2019-101894 A | 6/2019 | |
| JP | 6658312 B2 | 3/2020 | |
| JP | 2020-136335 A | 8/2020 | |

OTHER PUBLICATIONS

Written Opinion issued in International Application No. PCT/JP2022/007654, dated May 17, 2022 (8 pages).

* cited by examiner (A)

| SET TARGET TEMPERATURE OF COOLING WATER, BASED ON MINIMUM VALUE OF MAXIMUM ALLOWABLE TEMPERATURE OF ELECTRONIC COMPONENT | — SA7 |

| SET VARIOUS TARGET VALUES TO SATISFY SET TARGET TEMPERATURE AND REQUIRED COOLING AMOUNT OF COOLING WATER | — SA8 |

(B)

| MODE SELECTION UNIT | — 51 |
| CALCULATION UNIT | — 52 |
| CORRECTION UNIT | — 54 |
| COOLING CONDITION SETTING UNIT | — 53 |

— 40a

MODE SELECTION UNIT —51

CALCULATION UNIT —52

COOLING CONDITION SETTING UNIT —53

NOZZLE FLOW RATE CONTROL UNIT —55

40b

COOLING UNIT CONTROL UNIT

MODE SELECTION UNIT —51

CALCULATION UNIT —52

COOLING CONDITION SETTING UNIT —53a

60

LIQUID COOLANT CIRCULATION UNIT CONTROL UNIT —70

COOLING LIQUID CIRCULATION UNIT, METHOD FOR CONTROLLING SAME, AND PROGRAM

TECHNICAL FIELD

The present disclosure relates to a liquid coolant circulation unit that circulates a liquid coolant to an immersion tank, a method for controlling the same, and a program.

BACKGROUND ART

PTL 1 discloses an immersion cooling system that cools an electronic device such as a server and a storage by immersing the electronic device in a liquid coolant in a data center. Specifically, PTL 1 discloses an immersion cooling system that circulates the liquid coolant in the following way. The liquid coolant heated after cooling the electronic device via a cooling tank is cooled in a heat exchanger, and the cooled liquid coolant is returned to the cooling tank.

CITATION LIST

Patent Literature

[PTL 1] Japanese Patent No. 6658312

SUMMARY OF INVENTION

Technical Problem

For example, a calorific value of the electronic device is changed without being constant. Therefore, it is desirable to change a cooling condition depending on the calorific value.

The present disclosure is made in view of the above-described circumstances, and an object of the present disclosure is to provide a liquid coolant circulation unit which can set a cooling condition in view of a calorific value of an electronic device, a control method therefor, and a program.

Solution to Problem

According to a first aspect of the present disclosure, there is provided a liquid coolant circulation unit that circulates a liquid coolant to an immersion tank for cooling a plurality of electronic devices by immersing the plurality of electronic devices in the liquid coolant, the liquid coolant circulation unit including a flow rate adjustment unit provided in a liquid coolant circulation path for circulating the liquid coolant to the immersion tank, a heat exchanger provided in the liquid coolant circulation path and exchanging heat between the liquid coolant and a cooling medium, and a liquid coolant circulation unit control unit. The liquid coolant circulation unit control unit includes a mode selection unit that selects any one of a plurality of cooling modes, a calculation unit that calculates a required cooling amount, based on parameters relating to operation states of the plurality of electronic devices, and a cooling condition setting unit that sets a target value of a parameter relating to a flow rate of the liquid coolant, based on the selected cooling mode and the required cooling amount.

According to a second aspect of the present disclosure, there is provided a control method for a liquid coolant circulation unit that circulates a liquid coolant to an immersion tank for cooling a plurality of electronic devices by immersing the plurality of electronic devices in the liquid coolant. The liquid coolant circulation unit includes a flow rate adjustment unit provided in a liquid coolant circulation path for circulating the liquid coolant to the immersion tank, and a heat exchanger provided in the liquid coolant circulation path and exchanging heat between the liquid coolant and a cooling medium. The control method includes a step of selecting any one of a plurality of cooling modes, a step of calculating a required cooling amount, based on parameters relating to operation states of the plurality of electronic devices, and a step of setting a target value of a parameter relating to a flow rate of the liquid coolant, based on the selected cooling mode and the required cooling amount.

According to a third aspect of the present disclosure, there is provided a program for causing a computer to function as the liquid coolant circulation unit control unit.

According to a fourth aspect of the present disclosure, there is provided an immersion cooling system including the liquid coolant circulation unit and the immersion tank.

Advantageous Effects of Invention

A cooling condition can be set in view of a calorific value of an electronic device.

DESCRIPTION OF EMBODIMENTS

Hereinafter, a plurality of embodiments according to the present disclosure will be described with reference to the drawings.

First Embodiment

Hereinafter, a first embodiment of the present disclosure will be described.

Figure 1:
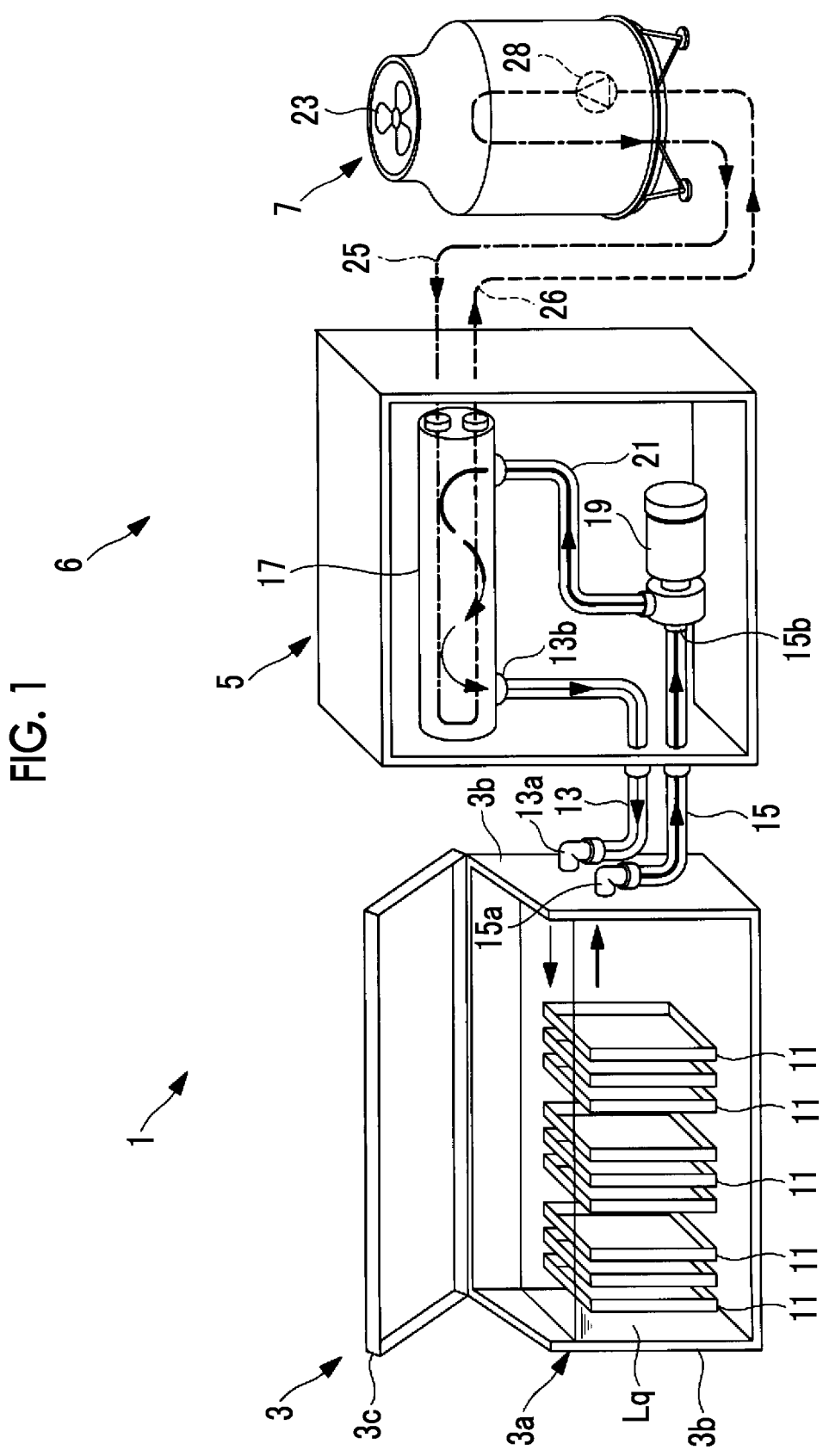
FIG. 1 is a system configuration diagram schematically illustrating a system configuration of an immersion cooling system according to a first embodiment of the present disclosure.

FIG. 1 is a schematic view illustrating a schematic configuration of an immersion cooling system 1 according to the present embodiment. The immersion cooling system 1 includes an immersion tank (container) 3 and a liquid coolant circulation system 6.

The immersion tank 3 is a bottomed container that stores a liquid coolant Lq. The immersion tank 3 includes a main body 3a which is bottomed and which has side wall portions 3b on four sides, and an opening-closing lid 3c provided on an upper surface of the main body 3a.

As the liquid coolant Lq, a liquid having electrical insulation is used, and, for example, silicone-based oil is used. The immersion tank 3 is filled with the liquid coolant Lq to a height at which a whole substrate 11 installed inside the main body 3a of the immersion tank 3 is immersed.

The opening-closing lid 3c is opened and closed by pivoting around an upper end of the side wall portion 3b. The opening-closing lid 3c is brought into an open state when the substrate 11 is installed or removed inside the main body 3a of the immersion tank 3 or during maintenance inside the immersion tank 3. The opening-closing lid 3c is brought into a closed state during normal use (when the substrate 11 is cooled).

A plurality of electronic devices are immersed inside the main body 3a of the immersion tank 3, for example, in a form of being mounted on each substrate 11. Examples of the electronic devices include a computer (server) and storage. As an example, FIG. 1 illustrates a case where a plurality of the substrates 11 are installed inside the immersion tank 3. For example, the substrates 11 are each substrates forming the server, and are arranged at a predetermined interval in a state where a longitudinal direction is directed to a vertical direction. A disposition of the substrates and a mounting mode of the electronic device are not limited thereto.

The liquid coolant circulation system 6 circulates a liquid coolant to the immersion tank 3. Specifically, in the liquid coolant circulation system 6, the liquid coolant heated by cooling the electronic device mounted on the substrate 11 in the immersion tank 3 is cooled by a heat exchanger 17, and the cooled liquid coolant is returned to the immersion tank 3 to circulate the liquid coolant.

The liquid coolant circulation system 6 includes a liquid coolant circulation unit 5, a cooling unit 7, and a system control device 40 (refer to FIG. 4) (to be described later). The liquid coolant circulation unit 5 includes a liquid coolant circulation path, a pump 19, and the heat exchanger 17. For example, the liquid coolant circulation path includes a liquid return pipe 15, a liquid coolant discharge pipe 21, and a liquid feeding pipe 13. The pump 19 and the heat exchanger 17 are provided in the liquid coolant circulation path.

For example, the liquid coolant circulation unit 5 is connected to the immersion tank 3 via the liquid feeding pipe 13 and the liquid return pipe 15. A downstream end 13a of the liquid feeding pipe 13 is connected to the side wall portion 3b of the immersion tank 3. An upstream end 13b of the liquid feeding pipe 13 is connected to the heat exchanger 17 installed inside the liquid coolant circulation unit 5. An upstream end 15a of the liquid return pipe 15 is connected to the side wall portion 3b of the immersion tank 3. A downstream end 15b of the liquid return pipe 15 is connected to the pump (first flow rate adjustment unit) 19 installed inside the liquid coolant circulation unit 5 to circulate the liquid coolant.

The heat exchanger 17 exchanges heat between cooling water supplied from the cooling unit 7 and the liquid coolant supplied from the pump 19 via the liquid coolant discharge pipe 21. The liquid coolant is cooled by exchanging the heat with the cooling water in the heat exchanger 17.

For example, the pump 19 is driven by an electric motor, and a discharge amount is controlled by a system control device (refer to FIG. 4) (to be described later).

The liquid coolant circulation unit 5 is provided with a temperature sensor (not illustrated) for measuring each of a temperature of the liquid coolant flowing into the heat exchanger 17 and an outlet temperature of the liquid coolant fed from the heat exchanger 17. The liquid coolant circulation unit 5 may be provided with a flow rate sensor for measuring a liquid coolant flow rate.

The cooling unit 7 includes a cooling water circulation path through which the cooling water (cooling medium) circulates. For example, the cooling water circulation path includes a cooling water supply pipe 25 and a cooling water return pipe 26. A pump (second flow rate adjustment unit) 28 for circulating the cooling water is provided in the cooling water circulation path. For example, the pump 28 is driven by an electric motor, and the discharge amount is controlled by the system control device (refer to FIG. 4) (to be described later).

The cooling unit 7 includes a fan (cooling part) 23, and outside air for cooling is drawn in by the fan 23. Starting/stopping and a rotation speed of the fan 23 are controlled by the system control device (refer to FIG. 4) (to be described later). The cooling water circulating in the cooling water circulation path is cooled by exchanging the heat with the outside air drawn in by the fan 23.

In the cooling unit 7, the cooling water cooled by exchanging the heat with the outside air is supplied to the heat exchanger 17 via the cooling water supply pipe 25. The cooling water whose heat is exchanged in the heat exchanger 17 is returned to the cooling unit 7 via the cooling water return pipe 26.

The cooling unit 7 is provided with temperature sensors (not illustrated) for measuring each of an inlet temperature of the cooling water, which is a temperature of the cooling water flowing into the heat exchanger 17, and an outlet temperature of the cooling water, which is a temperature of the cooling water returned from the heat exchanger 17. The cooling unit 7 may be provided with a flow rate sensor for measuring a flow rate of the cooling water.

Figure 2:
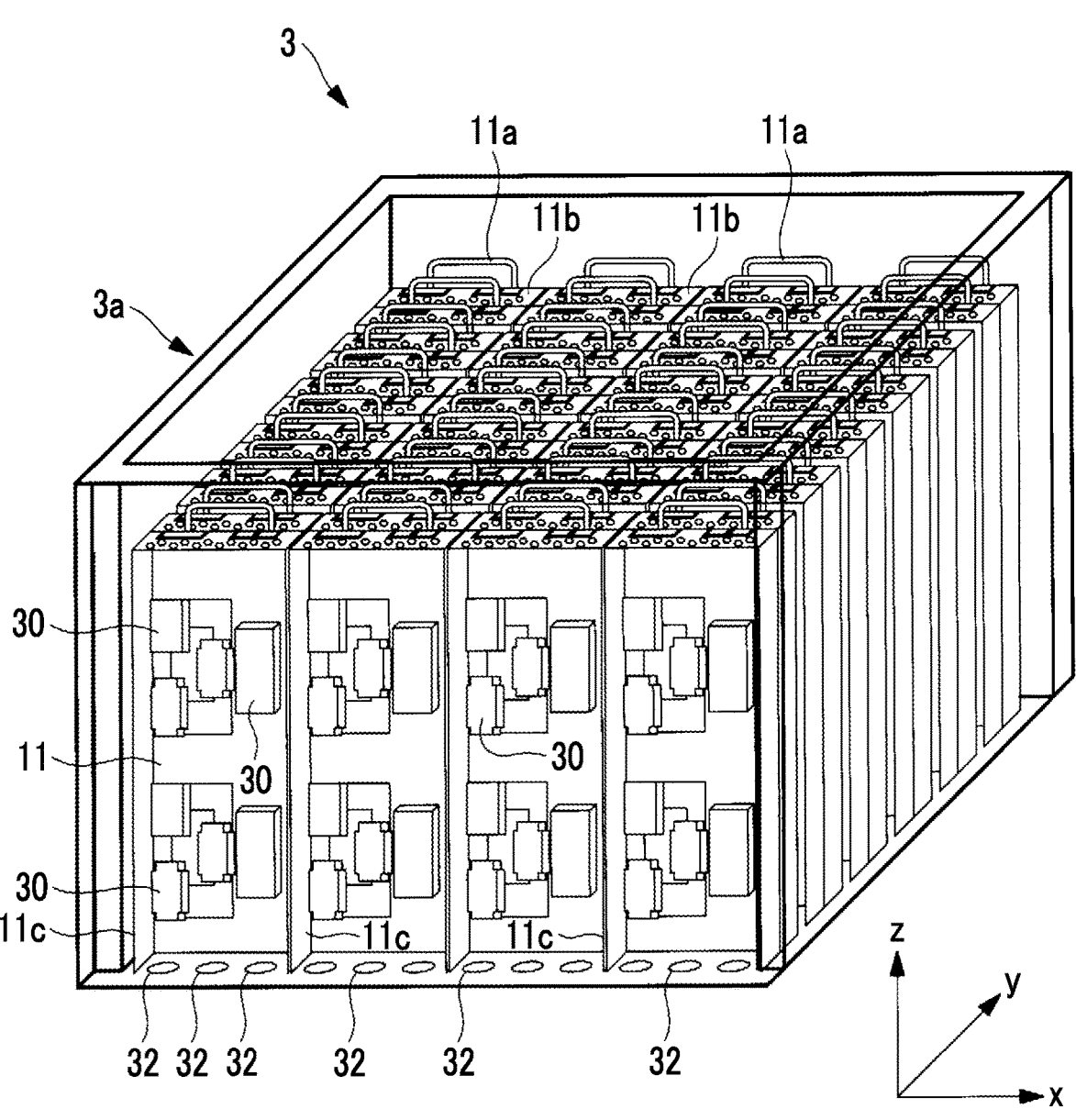
FIG. 2 is a perspective view illustrating a specific example of an interior of an immersion tank in FIG. 1.

FIG. 2 illustrates the plurality of substrates 11 installed inside the main body 3a of the immersion tank 3. In an example illustrated in FIG. 2, four substrates 11 are provided in a width direction (x-direction in FIG. 2), and twelve substrates 11 are provided in a depth direction (y-direction in FIG. 2). However, the number of the substrates 11 installed is not limited thereto.

Each substrate 11 is equipped with a plurality of electronic devices 30 such as a CPU for forming a server, a power supply unit, a memory, a storage such as a hard disk or a solid-state drive (SSD), and a communication unit. The electronic devices 30 generate the heat during an operation of the server, and are cooled by the liquid coolant Lq.

A clamp portion 11*a* is fixed to an upper end of each substrate 11. The clamp portion 11*a* is provided to protrude upward from the upper end of the substrate 11, and has a portal shape formed by bending a rod-shaped body. The substrate 11 is installed and removed by an operator gripping the clamp portion 11*a*.

A perforated wall 11*b* is provided to be orthogonal to the upper end of each substrate 11. The perforated wall 11*b* is erected on a surface side provided with the electronic device 30. For example, the perforated wall 11*b* is made of punching metal in which a large number of holes are formed. The flow rate of the liquid coolant flowing on a surface of the substrate 11 is adjusted by appropriately setting the number and a diameter of the holes of the perforated wall 11*b*.

For example, side plates 11*c* extending in an upward-downward direction are provided on both sides of each substrate 11. The side plates 11*c* are provided to be erected on the surface side provided with the electronic device 30, and are continuously provided over the entire longitudinal direction (upward-downward direction, z-direction) of the substrate 11. Since both sides of the substrate 11 are surrounded with the side plates 11*c*, a flow of the liquid coolant Lq flowing on the surface of the substrate 11 is guided.

A plurality of nozzles 32 are provided below each substrate 11. The nozzle 32 discharges the liquid coolant so that the liquid coolant flows from one end (lower end) toward the other end (upper end) of the substrate 11 on the surface of the substrate 11 provided with the electronic device 30.

For example, the plurality of nozzles 32 are provided for each substrate 11. Specifically, the plurality of nozzles 32 are provided parallel in the width direction (x-direction) intersecting with a flow direction (z-direction) of the liquid coolant from one end (lower end) toward the other end (upper end) of the substrate 11. In this manner, a plurality of flows of the liquid coolant Lq are formed parallel from one end (lower end) toward the other end (upper end) of the substrate 11. The number of the nozzles 32 may be two or more with respect to one substrate 11, and is appropriately set depending on a flow and a cooling state of the liquid coolant Lq.

The nozzle 32 is similarly provided corresponding to each substrate 11 in the depth direction (y-direction in FIG. 2). Therefore, the nozzle 32 is also provided between the respective substrates 11 aligned in the y-direction.

Figure 3:
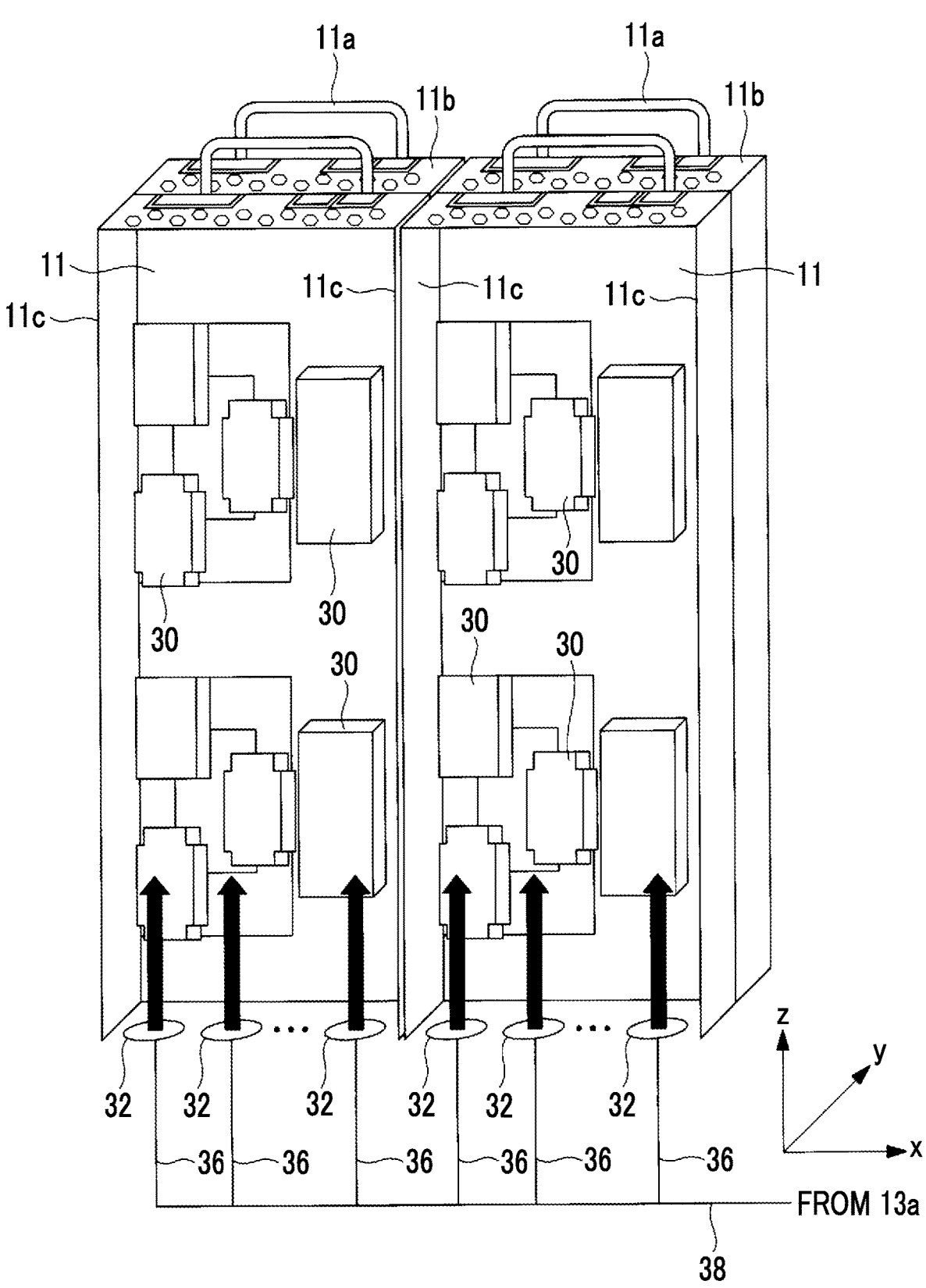
FIG. 3 is a perspective view illustrating a flow of a liquid coolant with respect to each substrate in FIG. 2.

As illustrated in FIG. 3, an upstream side of each nozzle 32 is connected to a supply main pipe 38 via a branch pipe 36. An upstream side of the supply main pipe 38 is connected to the downstream end 13*a* (refer to FIG. 1) of the liquid feeding pipe 13. Therefore, the liquid coolant Lq guided from the liquid feeding pipe 13 is distributed to each branch pipe 36 via the supply main pipe 38.

As an example, the immersion cooling system 1 having this configuration is operated as follows.

When the pump 19 is controlled by the system control device 40 (to be described later), the liquid coolant Lq flows and is guided to the heat exchanger 17. In the heat exchanger 17, the liquid coolant Lq is cooled by exchanging the heat with the cooling water cooled by the cooling unit 7. The liquid coolant Lq flowing out from the heat exchanger 17 is guided to the immersion tank 3 through the liquid feeding pipe 13. As illustrated in FIG. 3, the liquid coolant Lq guided to the immersion tank 3 is distributed to each branch pipe 36 from the liquid feeding pipe 13 through the supply main pipe 38. The liquid coolant Lq guided to each branch pipe 36 is discharged after being guided to the nozzle 32.

The liquid coolant Lq discharged from each nozzle 32 is guided to the lower end of the substrate 11, passes over the surface of the substrate 11 provided with the electronic device 30 while being guided by the side plates 11*c*, and flows toward the upper end of the substrate 11. At this time, a calorific value generated from the electronic device 30 is transferred to the liquid coolant Lq, and the electronic device 30 is cooled.

The liquid coolant Lq heated by cooling the electronic device 30 passes through the holes of the perforated wall 11*b* provided in the upper end of the substrate 11, and is discharged from above the substrate 11. The liquid coolant Lq discharged from above the substrate 11 is merged and mixed with the liquid coolant Lq stored inside the main body 3*a* of the immersion tank 3.

A portion of the liquid coolant Lq stored inside the main body 3*a* is extracted from the liquid return pipe 15, is guided to the heat exchanger 17 via the pump 19, is cooled by the heat exchanger 17, and is guided to the immersion tank 3 again.

Figure 4:
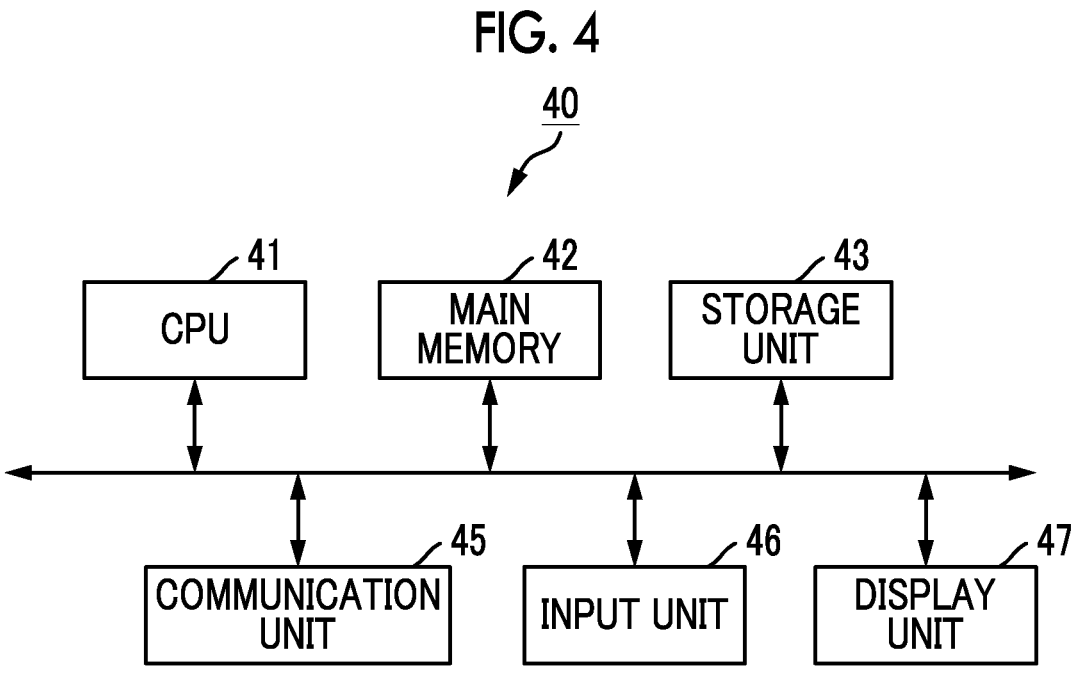
FIG. 4 is a view illustrating an example of a hardware configuration of a system control device according to the first embodiment of the present disclosure.

Next, the system control device 40 according to the present embodiment will be described. FIG. 4 is a view illustrating an example of a hardware configuration of the system control device 40 according to the present embodiment. As illustrated in FIG. 4, the system control device 40 is a so-called computer, and includes a central processing unit (CPU) 41, a main memory 42, a storage unit 43, and a communication unit 45, for example. The system control device 40 may include an input unit 46 and a display unit 47, for example. In this case, the input unit 46 and the display unit 47 may be connected to the communication unit 45 via a communication line, and may be configured so that a so-called remote operation can be performed, for example, a remote input can be realized.

The above-described components are directly or indirectly connected to each other via a bus, and perform various processes in cooperation with each other.

For example, the CPU 41 controls the whole liquid coolant circulation system 6 using an operating system (OS) stored in the storage unit 43 connected via a bus, and performs various processes by executing various programs stored in the storage unit 43.

For example, the main memory 42 includes a writable memory such as a cache memory or a random-access memory (RAM), and is used as a work region for reading an execution program of the CPU 41 and writing processing data of the execution program.

The storage unit 43 is a non-transitory computer-readable storage medium. Examples thereof include a read-only memory (ROM), a hard disk drive (HDD), and a flash memory. For example, the storage unit 43 stores an OS for controlling the whole liquid coolant circulation system 6, such as Windows (registered trademark), iOS (registered trademark), and Android (registered trademark). For example, the storage unit 43 may store a basic input/output system (BIOS). The storage unit 43 may store various device drivers for operating peripheral devices by using hardware, various application software, various data, and files. The storage unit 43 may store a program for realizing various processes and various data required for realizing various processes.

The communication unit 45 functions as an interface for transmitting and receiving information by being connected to a network and communicating with other devices. For example, the communication unit 45 communicates with other devices in a wired or wireless manner. Examples of wireless communication include Bluetooth (registered trademark), Wi-Fi, and communication using a dedicated communication protocol. As an example of wired communication, a wired local area network (LAN) may be used.

For example, the input unit 46 is a keyboard, a mouse, or a touch pad, and is a user interface for a user to give an instruction to the liquid coolant circulation system 6.

For example, the display unit 47 is a liquid-crystal display or an organic electroluminescence (EL) display. The display unit 47 may be a touch panel display on which a touch panel is superimposed.

Figure 5:
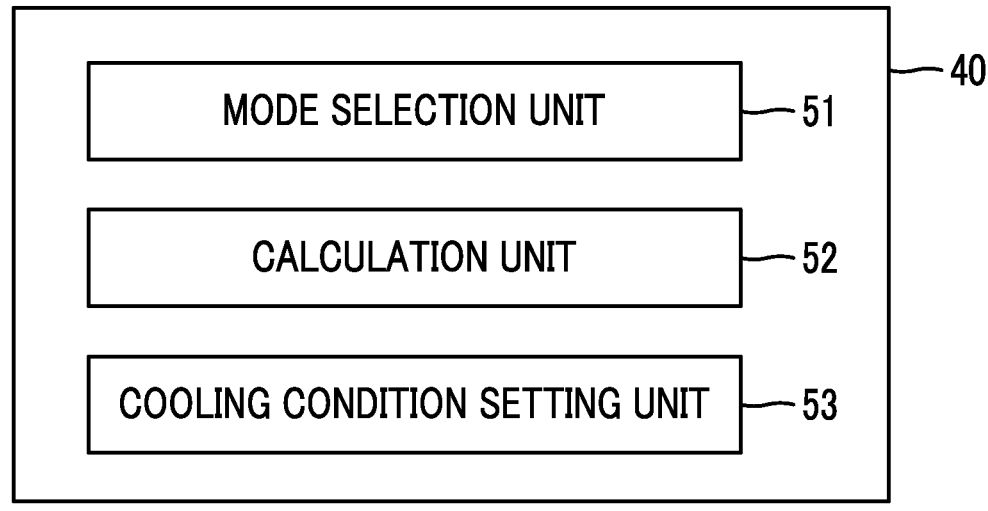
FIG. 5 is a functional block diagram illustrating an example of a function provided in the system control device according to the first embodiment of the present disclosure.

FIG. 5 is a functional block diagram illustrating an example of a function provided in the system control device 40. As illustrated in FIG. 5, for example, the system control device 40 includes a mode selection unit 51, a calculation unit 52, and a cooling condition setting unit 53.

For example, all or some of the functions are realized by a processing circuitry. For example, a series of processes for realizing functions described below is stored in the storage unit 43 in a form of a program (for example, a system control program), as an example. The CPU 41 reads the program into the main memory 42, and executes information processing and calculation processing to realize various functions.

A form in which the program is installed in advance in the storage unit 43, a form in which the program is provided in a state of being stored in another computer-readable storage medium, or a form in which the program is distributed via wired or wireless communication means may be applied. The computer-readable storage medium is a magnetic disc, a magneto-optical disc, a CD-ROM, a DVD-ROM, or a semiconductor memory.

The mode selection unit 51 includes a plurality of modes. The plurality of modes may have a performance priority mode that prioritizes performance of the electronic device 30. The plurality of modes may have an energy saving priority mode that prioritizes power usage efficiency. The plurality of modes may have a normal mode.

The mode selection unit 51 selects any one of the plurality of modes. For example, the mode selection unit 51 selects any mode in accordance with a predetermined schedule. For example, in the mode selection unit 51, a cooling mode to be selected may be scheduled in advance, based on a server operation schedule, and the mode selection unit 51 may select the cooling mode in accordance with this schedule. The mode selection unit 51 may select a designated cooling mode, based on an input instruction from the input unit 46.

The calculation unit 52 calculates a required cooling amount, based on parameters relating to operation states of the plurality of electronic devices 30. Here, as an example of the parameters relating to the operation states of the plurality of electronic devices 30, for example, consumed power, power consumption, a CPU load factor, a heat generation temperature, or a combination of two or more of the parameters can be used.

A calorific value of the electronic device 30 is changed depending on the operation state. Therefore, the calorific value of the electronic device 30 can be estimated by using the parameter relating to the operation state of the electronic device 30, and in this manner, the required cooling amount can be estimated.

When the CPU load factor is acquired, the electronic device 30 and the system control device 40 start to communicate with each other. Therefore, a load on the electronic device 30 increases. In contrast, when a parameter which does not require direct communication with the electronic device 30, for example, the consumed power or the power consumption, is used as the parameter relating to the operation state, the required cooling amount can be calculated without imposing a processing load on the electronic device 30. Instead of the CPU load factor, a method of estimating the CPU load factor, based on a job assigned to the electronic device 30, may be adopted.

For example, the calculation unit 52 has a calculation expression in which the required cooling amount including the parameter relating to the operation state of the electronic device 30 is used as a variable. The required cooling amount is calculated by inputting a detection value of the parameter into the calculation expression at each time.

For example, when the power consumption is used as the parameter relating to the operation state of the electronic device 30, the required cooling amount may be calculated by multiplying the power consumption by a predetermined proportional coefficient. The calculation expression is an example, and is not limited thereto. For example, a relationship between the parameter relating to the operation state of the electronic device 30 and the required cooling amount may be obtained by a preliminary test or a simulation. For example, the required cooling amount is determined, based on a temperature at which the electronic device 30 can achieve predetermined calculation capacity, and is appropriately set in accordance with the obtained calculation capacity.

The immersion cooling system 1 includes a configuration for detecting the parameter relating to the operation state of the electronic device 30.

For example, the immersion cooling system 1 includes a power consumption meter (not illustrated) that measures consumed power of the electronic device 30, and a communication unit (not illustrated) that transmits a signal output from the power consumption meter to the system control device 40. As the power consumption meter, for example, a known sensor such as a watt monitor used by being plugged into an electric outlet can be used.

The immersion cooling system 1 may include a temperature sensor (not illustrated) that measures a temperature of the electronic device 30, and a communication unit (not illustrated) that transmits a signal output from the temperature sensor to the system control device 40. For example, the temperature sensor is attached to a component having a high calorific value in the electronic devices 30, and transmits a measurement value to the system control device 40 through the communication unit.

The parameter relating to the operation state of the electronic device 30 may be acquired for each substrate 11 (for example, for each server) or for each substrate group (for each server group) including a plurality of the substrates 11. That is, as long as a parameter value of the electronic devices 30 immersed in the immersion tank 3 as a whole can be obtained, a method for acquiring the parameter is not limited.

For example, the cooling condition setting unit 53 sets a parameter relating to a flow rate of the liquid coolant and a parameter relating to the temperature of the cooling water or/and a parameter relating to a flow rate of the cooling water, based on the required cooling amount calculated by the calculation unit 52.

For example, when the normal mode is selected, the cooling condition setting unit 53 sets a target flow rate of the liquid coolant, a target temperature of the cooling water, and a target flow rate of the cooling water, based on the required cooling amount. Here, the target temperature of the cooling water is a target temperature of the cooling water to be supplied to the heat exchanger 17 (refer to FIG. 1).

As an example, the cooling condition setting unit 53 has one or a plurality of pieces of map information in which the required cooling amount and the flow rate of a liquid coolant, the temperature of a cooling water, and the flow rate of the cooling water are associated with each other, and uses this map information. In this manner, the cooling condition setting unit 53 obtains the target flow rate of the liquid coolant, the target temperature of the cooling water, and the target flow rate of the cooling water from the required cooling amount.

As another example, the cooling condition setting unit 53 may have the calculation expression for obtaining the target flow rate of the liquid coolant, the target temperature of the cooling water, and the target flow rate of the cooling water from the required cooling amount, and may use this calculation expression. In this manner, the cooling condition setting unit 53 may calculate the target flow rate of the liquid coolant, the target temperature of the cooling water, and the target flow rate of the cooling water from the required cooling amount.

Here, a minimum limit temperature of the inlet temperature of the cooling water is determined, based on external conditions. For example, a limit temperature of the inlet temperature of the cooling water is a value obtained by adding a predetermined temperature (for example, 5° C.) to an outside air wet bulb temperature. The minimum limit temperature is a limit temperature at which the cooling water can be cooled when the fan 23 is driven at a maximum rotation speed. Therefore, for example, when the target temperature of the cooling water is equal to or lower than the minimum limit temperature determined based on an outside air condition, the target temperature of the cooling water may be set to the minimum limit temperature, and thereafter, other parameters, that is, the target flow rate of the liquid coolant and the target flow rate of the cooling water, may be set to obtain the required cooling amount.

For example, a target rotation speed of the fan 23 is calculated by using the target temperature of the cooling water (inlet temperature of the cooling water of the heat exchanger 17), the outlet temperature of the cooling water, and the target flow rate of the cooling water in a predetermined calculation expression. Here, for example, the cooling amount in the cooling unit 7 is expressed by the following equation (1). Therefore, the target rotation speed of the fan 23 is set so that the required cooling amount can be obtained in the following calculation expression. The rotation speed of the fan 23 may be determined, based on the calculation expression that further includes an outside air condition (for example, the outside air wet bulb temperature) as the parameter.

Cooling Amount=(Outlet Temperature of Cooling Water of Heat Exchanger−Inlet Temperature of Cooling Water of Heat Exchanger)×Cooling Water Flow Rate (1)

For example, when the performance priority mode is selected as the cooling mode, the cooling condition setting unit 53 sets the target temperature of the cooling water to the minimum temperature derived from the outside air condition. The cooling condition setting unit 53 may set the target flow rate of the liquid coolant to the maximum flow rate, and may set the target rotation speed of the fan 23 to the maximum rotation speed. Furthermore, the cooling condition setting unit 53 may also set the target flow rate of the cooling water to the maximum flow rate.

In this manner, when the performance priority mode is selected, the liquid coolant circulation system 6 is controlled to obtain a maximum cooling effect derived from the outside air condition or an effect close to the maximum cooling effect.

When the energy saving priority mode is selected as the cooling mode, the cooling condition setting unit 53 may set the target temperature of the cooling water, based on a predetermined temperature determined based on heat resistance characteristics of an electronic component forming the electronic device 30, and may optimize the target flow rate of the liquid coolant, the target flow rate of the cooling water, and the target rotation speed of the fan 23 to satisfy the set target temperature and the required cooling amount of the cooling water and to minimize the consumed power.

Here, for example, description of the "predetermined temperature" means a lowest allowable maximum temperature or a temperature having a predetermined tolerance in an allowable maximum temperature thereof in an allowable maximum temperature of the electronic component immersed in the immersion tank 3.

Optimizing the target flow rate of the liquid coolant, the target flow rate of the cooling water, and the target rotation speed of the fan 23 can be realized by using a known optimization method.

The cooling condition setting unit 53 may sequentially set various target values to satisfy the required cooling amount, based on a predetermined order set in advance. For example, the predetermined order is an element order whose power reduction effect is high. For example, when the power reduction effect is higher in the order of the power of the fan 23, the power of the pump 28, and the power of the pump 19, the target values may be set in this order.

When the cooling condition is set by the cooling condition setting unit 53 in this way, the pump 19 of the liquid coolant circulation unit 5, the pump 28 of the cooling unit 7, and the fan 23 are controlled, based on the set cooling condition. Specifically, a discharge amount of the pump 19 is controlled to the target flow rate by controlling an electric motor of the pump 19 at a frequency corresponding to the target flow rate of the liquid coolant. The discharge amount of the pump 28 is controlled to the target flow rate by controlling the electric motor of the pump 28 at a frequency corresponding to the target flow rate of the cooling water. The fan 23 is controlled, based on the target rotation speed of the fan 23.

Figure 6:
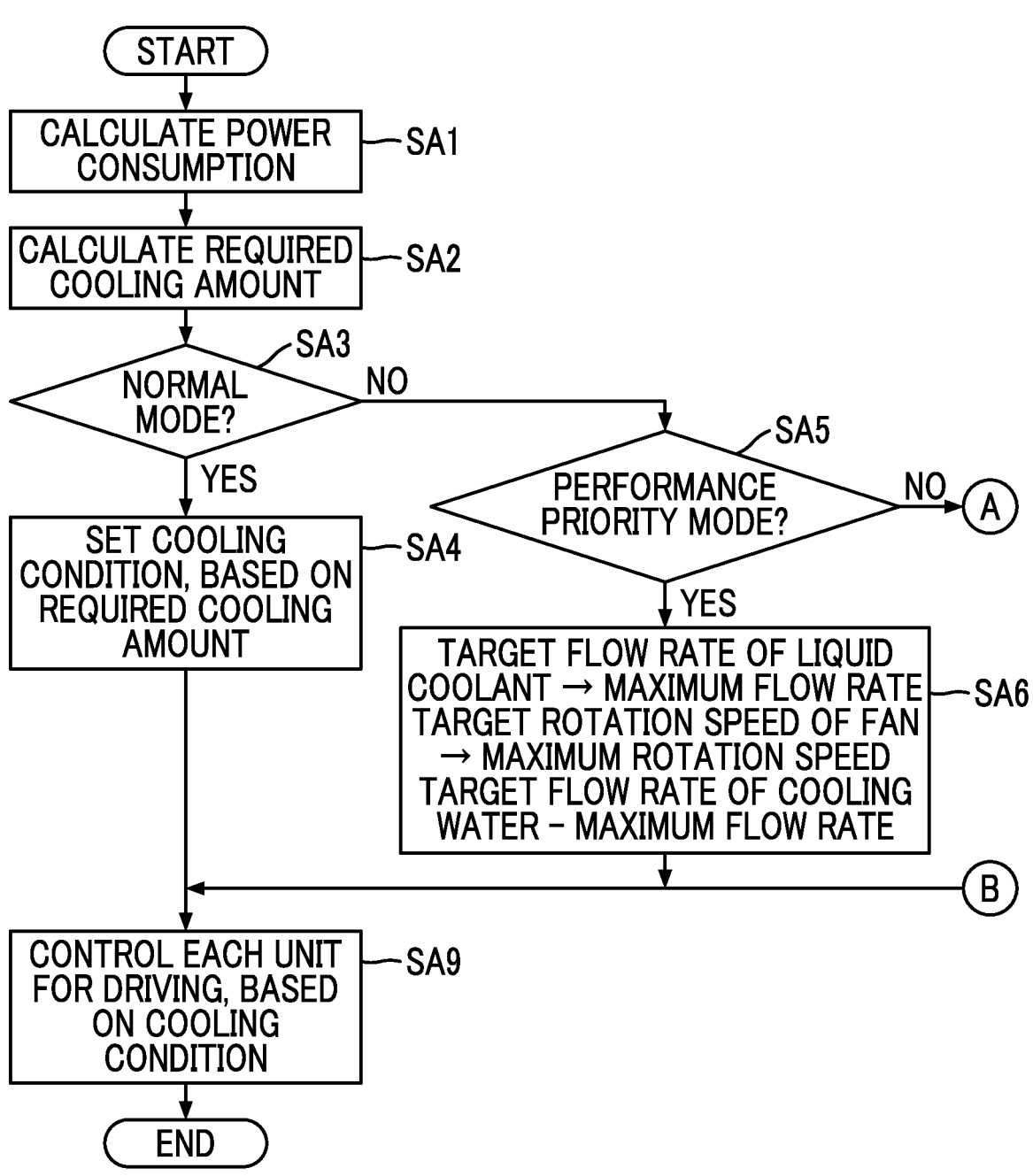
FIG. 6 is a flowchart illustrating an example of a procedure of a control method for a liquid coolant circulation system realized by the system control device according to the first embodiment of the present disclosure.
Figure 7:
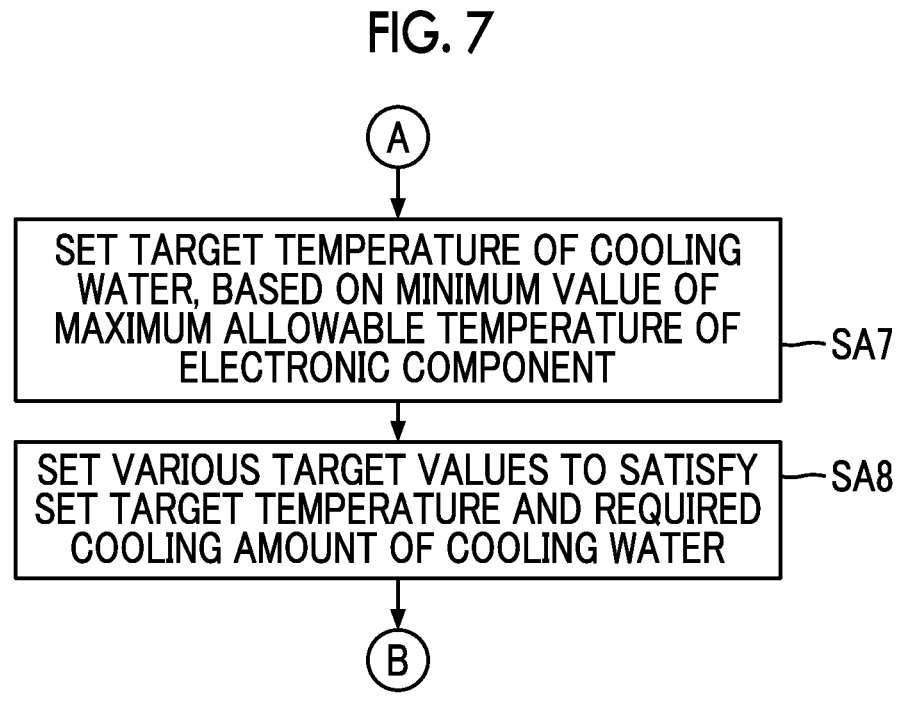
FIG. 7 is a flowchart illustrating an example of a procedure of a control method for the liquid coolant circulation system realized by the system control device according to the first embodiment of the present disclosure.

Next, a control method realized by the system control device 40 according to the present embodiment will be described with reference to FIGS. 6 and 7. FIGS. 6 and 7 are flowcharts illustrating an example of a procedure of the control method for the liquid coolant circulation system 6 according to the present embodiment. For example, a series of processes described below is realized by a processing circuitry. Specifically, the processes are realized in such a manner that the CPU 41 reads a program stored in the storage unit 43 into the main memory 42, and executes information processing and calculation processing.

Hereinafter, a case where the power consumption of the electronic device 30 is used as the parameter relating to the operation state of the electronic device 30 will be described as an example. Various variations are as described above, and the control method according to the present disclosure is not limited to various processes described below.

For example, the series of processes described below is repeatedly executed at a predetermined time interval.

First, the system control device 40 calculates the power consumption of the electronic devices 30 immersed in the immersion tank 3 as a whole, based on a measurement value measured by the power consumption meter (not illustrated) (SA1).

Subsequently, the system control device 40 calculates the required cooling amount by substituting the power consumption into a predetermined calculation expression (SA2).

Subsequently, it is determined whether or not the currently selected cooling mode is the normal mode (SA3). As a result, in a case of the normal mode (SA3: YES), the cooling condition is set, based on the required cooling amount (SA4). In this manner, the target flow rate of the liquid coolant, the target temperature of the cooling water, and the target flow rate of the cooling water are set, based on the required cooling amount. The target rotation speed of the fan is set, based on the target temperature of the cooling water, the outlet temperature of the cooling water of the heat exchanger, and the target flow rate of the cooling water.

When the normal mode is not selected as the cooling mode (SA3: NO), it is determined whether or not the performance priority mode is selected as the cooling mode (SA5). When the performance priority mode is selected (SA5: YES), the target flow rate of the liquid coolant is set to the maximum flow rate, the target rotation speed of the fan is set to the maximum rotation speed, and the target flow rate of the cooling water is set to the maximum flow rate (SA6).

On the other hand, when the performance priority mode is not selected as the cooling mode (SA5: NO), it is determined that the energy saving mode is selected as the cooling mode, and the target temperature of the cooling water is set, based on the minimum value of the maximum allowable temperature of many electronic components forming the electronic device 30 (SA7 in FIG. 7). Subsequently, the target flow rate of the liquid coolant, the target flow rate of the cooling water, and the target rotation speed of the fan 23 are set to satisfy the set target temperature and the required cooling amount of the cooling water (SA8).

Subsequently, the pump 19, the pump 28, and the fan 23 are driven, based on the set cooling conditions (SA9). For example, various target values are transmitted to drive control units (not illustrated) that respectively drive the pump 19, the pump 28, and the fan 23, and each drive control unit performs drive control corresponding to the target values.

In this manner, the rotation speed of the electric motor that drives the pump 19 is controlled for driving, based on the target flow rate of the liquid coolant. The rotation speed of the electric motor that drives the pump 28 is controlled for driving, based on the target flow rate of the cooling water. The fan 23 is controlled for driving, based on the target rotation speed of the fan 23.

In this way, the pumps 19 and 28 and the fan 23 are controlled for driving, based on the target value so that the liquid coolant is fed from the pump 19 to the heat exchanger 17 with the discharge amount corresponding to the required cooling amount. In the heat exchanger 17, the liquid coolant is cooled to a temperature based on the required cooling amount. In this manner, the liquid coolant whose temperature and flow rate satisfy the required cooling amount is fed to the immersion tank 3.

Operational effects of the present embodiment described above are as follows.

According to the present embodiment, the required cooling amount is calculated, based on the parameter relating to the operation state of the electronic device 30, and the cooling condition is set in view of the required cooling amount. The operation state of the electronic device 30 has a correlation with the calorific value of the electronic device 30. Therefore, the required cooling amount corresponding to the calorific value can be calculated by using the parameter relating to the operation state of the electronic device 30. In this manner, a proper cooling condition corresponding to the calorific value of the electronic device can be set.

Furthermore, according to the present embodiment, the plurality of cooling modes are provided, and the cooling condition is set, based on the selected cooling mode and the required cooling amount. Therefore, proper cooling corresponding to a desired mode can be performed.

For example, when the performance priority mode is selected as the cooling mode, the cooling condition is set to realize the maximum cooling effect derived from the outside air condition. In this manner, the maximum cooling effect or the cooling effect close to the maximum cooling effect can be realized, and the performance of the electronic device 30 can be maintained to be equal to or higher than the desired performance.

When the energy saving priority mode is selected as the cooling mode, the target temperature of the cooling water is set within a range not exceeding a predetermined temperature determined based on the maximum allowable temperature of the electronic component forming the electronic device 30. Furthermore, the cooling condition is set to satisfy the target temperature and the required cooling amount of the cooling water and to minimize the consumed power. In this manner, all of the electronic devices 30 can be maintained to have the maximum allowable temperature or lower while the consumed power is suppressed.

Second Embodiment

Next, a second embodiment of the present disclosure will be described. The present embodiment is different in that, in addition to the configuration of the first embodiment, a correction unit is provided. Therefore, in the following description, configurations different from those in the first embodiment will be mainly described. The same reference numerals will be assigned to common items, and description thereof will be omitted.

Figure 8:
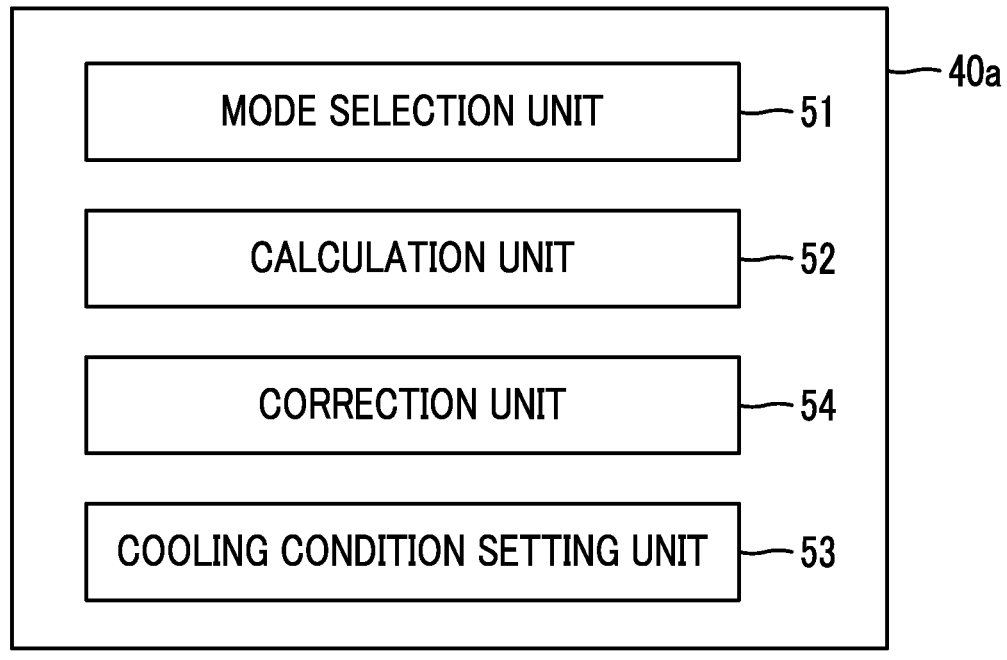
FIG. 8 is a functional block diagram illustrating an example of a function provided in a system control device according to a second embodiment of the present disclosure.

FIG. 8 is a functional block diagram illustrating an example of a function provided in a system control device 40a according to the present embodiment. As illustrated in FIG. 8, the system control device 40a includes a correction unit 54 that corrects the required cooling amount calculated by the calculation unit 52.

The correction unit 54 corrects the required cooling amount, based on a deviation between a distribution of the parameters indicating the operation states with respect to the disposition of the plurality of electronic devices 30 inside the immersion tank 3 and a cooling efficiency distribution inside the immersion tank 3. For example, the "distribution of the parameters indicating the operation states" is a power consumption distribution.

Figures 9A, 9B, 9C, 9D:
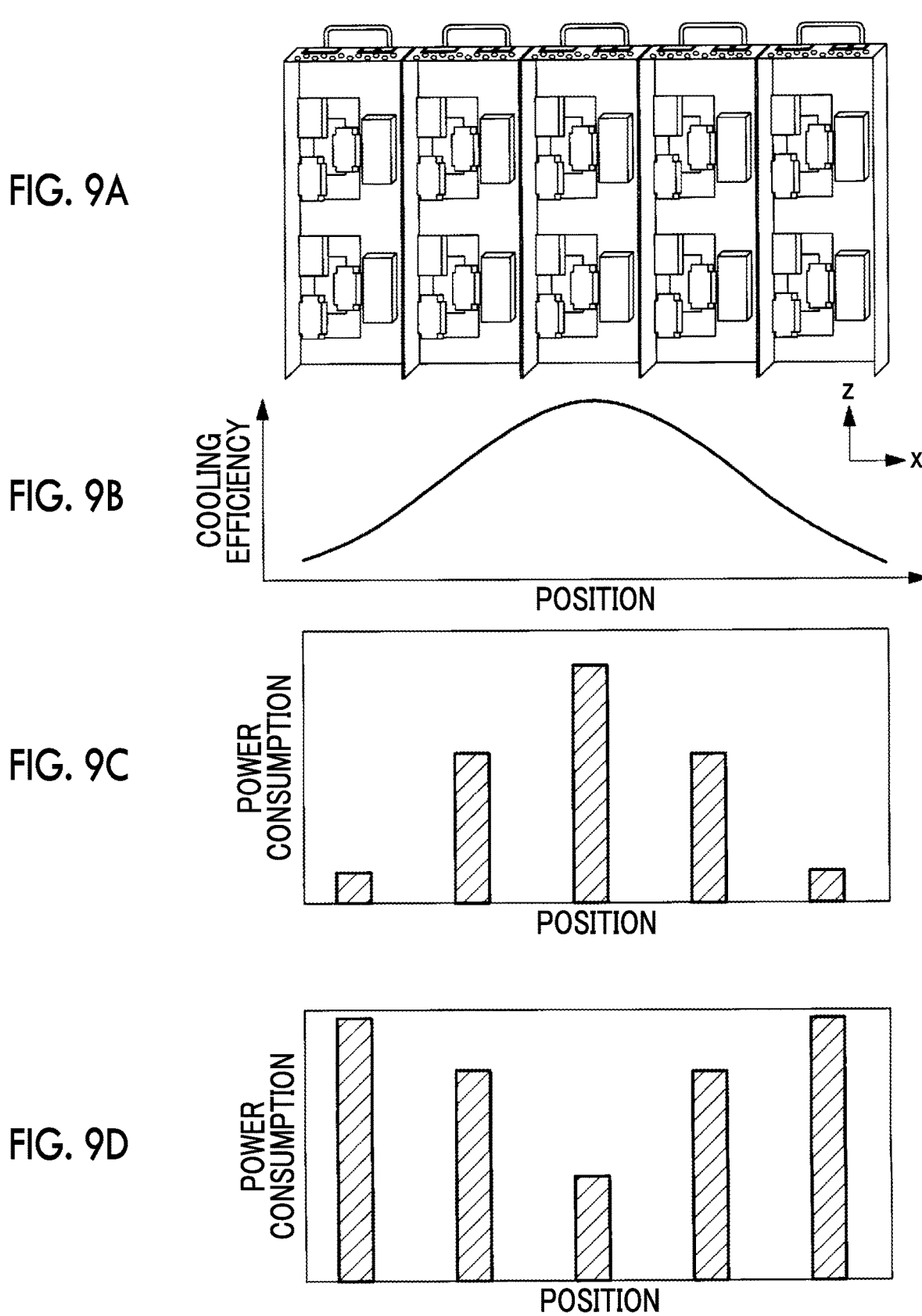
FIGS. 9A to 9D are views for describing a deviation between a power consumption distribution and a cooling efficiency distribution in the system control device according to the second embodiment of the present disclosure.

For example, as illustrated in FIG. 9A, the substrates 11, each of which is equipped with the plurality of electronic devices 30, are disposed along an X-axis inside the immersion tank 3. For convenience of description, FIG. 9A illustrates a two-dimensional view. However, as described above, the substrates 11 are also arranged in the depth direction (Y-axis).

Even when the liquid coolant is uniformly supplied from the nozzle 32 (refer to FIG. 3) provided below the immersion tank 3, as illustrated in FIG. 9B, the cooling effect is not uniform inside the immersion tank 3, and may vary in some cases. That is, in some cases, a position which is likely to be cooled and a position which is less likely to be cooled may exist. In an example illustrated in FIG. 9B, the cooling effect is highest in a central portion of the immersion tank 3, and the closer to a side portion, the lower the cooling effect is. Variations in the cooling effect illustrated in FIG. 9B are examples, and a degree of the variations is affected by various factors such as a structure and a shape of the immersion tank 3.

The power consumption of the plurality of substrates 11 (electronic devices 30) disposed inside the immersion tank 3 also varies depending on the operation state thereof. For example, FIGS. 9C and 9D are views respectively illustrating examples of variations (distribution) in the power consumption of the substrate 11 with respect to the positions. For example, the power consumption distribution illustrated in FIG. 9C indicates substantially the same tendency as the cooling effect distribution illustrated in FIG. 9B, and there is little deviation. In contrast, in the power consumption distribution illustrated in FIG. 9D, the power consumption of the substrate 11 disposed at the center is low, and the power consumption of the substrate 11 is higher toward the side portion. It can be understood that the power consumption distribution has a tendency opposite to that of the cooling efficiency distribution illustrated in FIG. 9B, and there is a large deviation between the distributions.

In the present embodiment, the required cooling amount is corrected, based on this deviation (deviation amount) between the cooling effect and the power consumption at each position of the immersion tank 3.

For example, the correction unit 54 has a preset cooling effect distribution. The power consumption distribution of the electronic devices 30 as a whole is calculated from the power consumption acquired from the power consumption meter, and the calculated power consumption distribution is compared with the cooling effect distribution to calculate a relative deviation amount in the distributions. For example, the distributions may be compared by using a known statistical method such as a comparing method in which each of the distributions is caused to be dimensionless, based on an average value or a standard deviation, and a comparing method in which each of the distributions is normalized.

An example of calculating the deviation amount includes the following method. For example, for each of the substrates 11, a difference between a value obtained by causing the power consumption to be dimensionless at the position and a value obtained by causing the cooling efficiency to be dimensionless at the position is calculated, and the calculated differences are accumulated to calculate the deviation amount in all of the distributions.

Then, the correction unit 54 calculates a correction amount, based on the deviation amount in the distributions calculated by the above-described method and on an average value of the power consumption of the electronic devices 30 as a whole. For example, the correction unit 54 calculates the correction amount by substituting each calculation value into a correction amount calculation expression in which the deviation amount in the distributions and the average value of the power consumption of the electronic devices 30 as a whole are included as variables. Here, the correction amount is expressed by a calculation expression in which the correction amount increases as the deviation amount increases. In the calculation expression, as the average value of the power consumption becomes greater, the correction amount decreases.

When the correction amount is calculated, the correction unit 54 uses the calculated correction amount to correct the required cooling amount calculated by the calculation unit

52. For example, the required cooling amount is corrected by adding the correction amount to the required cooling amount. When the correction amount is obtained as a correction coefficient, the required cooling amount may be corrected by multiplying the required cooling amount by the correction coefficient.

When the required cooling amount is corrected in this way, the corrected required cooling amount is output to the cooling condition setting unit 53, and the cooling condition is set by using the corrected required cooling amount.

As described above, according to the present embodiment, the system control device 40a includes the correction unit 54 that corrects the required cooling amount, based on the deviation between the distribution of the parameters (for example, the distribution of the power consumption) indicating the operation states with respect to the positions of the plurality of electronic devices 30 inside the immersion tank 3 and the cooling efficiency distribution with respect to the positions inside the immersion tank 3. In this manner, a proper cooling condition can be set in view of the variations in the calorific value and the variations in the cooling efficiency of the electronic devices 30 inside the immersion tank 3.

As the distribution of the parameters indicating the operation states, a distribution of a CPU load factor estimated from an execution status of a calculation job assigned to each substrate 11 (each server) may be used. As in the above-described power consumption, the CPU load factor also has a correlation with the calorific value of the electronic device 30. Therefore, instead of the power consumption, a distribution based on the CPU load factor may be calculated, and the calculated CPU load factor distribution and the cooling effect distribution may be compared with each other to calculate the deviation amount therebetween. The correction amount is calculated by using the deviation amount in the distributions and the average value of the CPU load factors in the same manner as described above.

Figure 10:
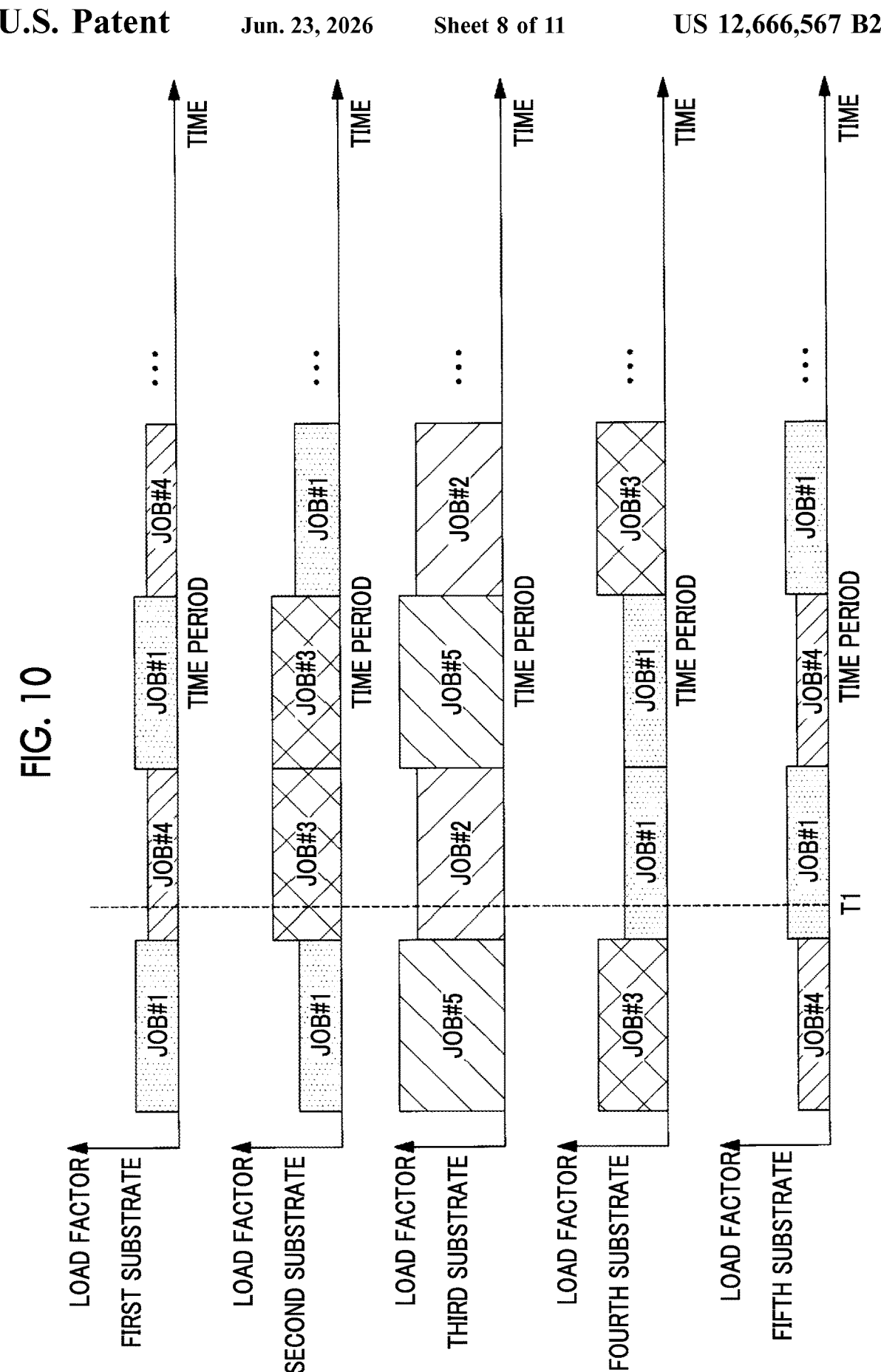
FIG. 10 is a view illustrating an example of a temporal change in a calculation job assigned to each substrate (first substrate to fifth substrate).

FIG. 10 is a view illustrating an example of a temporal change in the calculation job assigned to each of the substrates 11 (first substrate to fifth substrate). When the calculation load of the calculation job is high, the CPU load factor increases, and when the calculation load of the calculation job is low, the CPU load factor decreases. For example, focusing on time Ti, the CPU load on the second substrate and the third substrate is higher than the CPU load on the first substrate, the fourth substrate, and the fifth substrate. Therefore, at time Ti, it is presumed that the calorific values of the second substrate and the third substrate are higher than those of the other substrates.

The calorific value of the electronic device 30 is more slowly changed compared to a change in the CPU load factor. Therefore, the average value of the CPU load factors in a predetermined period may be calculated for each of the substrates 11, and the distribution of the average value may be used for comparison with the cooling effect distribution.

In this way, the CPU load factor is estimated from the calculation job, and the correction amount is calculated by using the distribution of the estimated CPU load factor. In this manner, the cooling condition can be set in view of the operation state of the electronic device 30 in the future.

Third Embodiment

Figure 11:
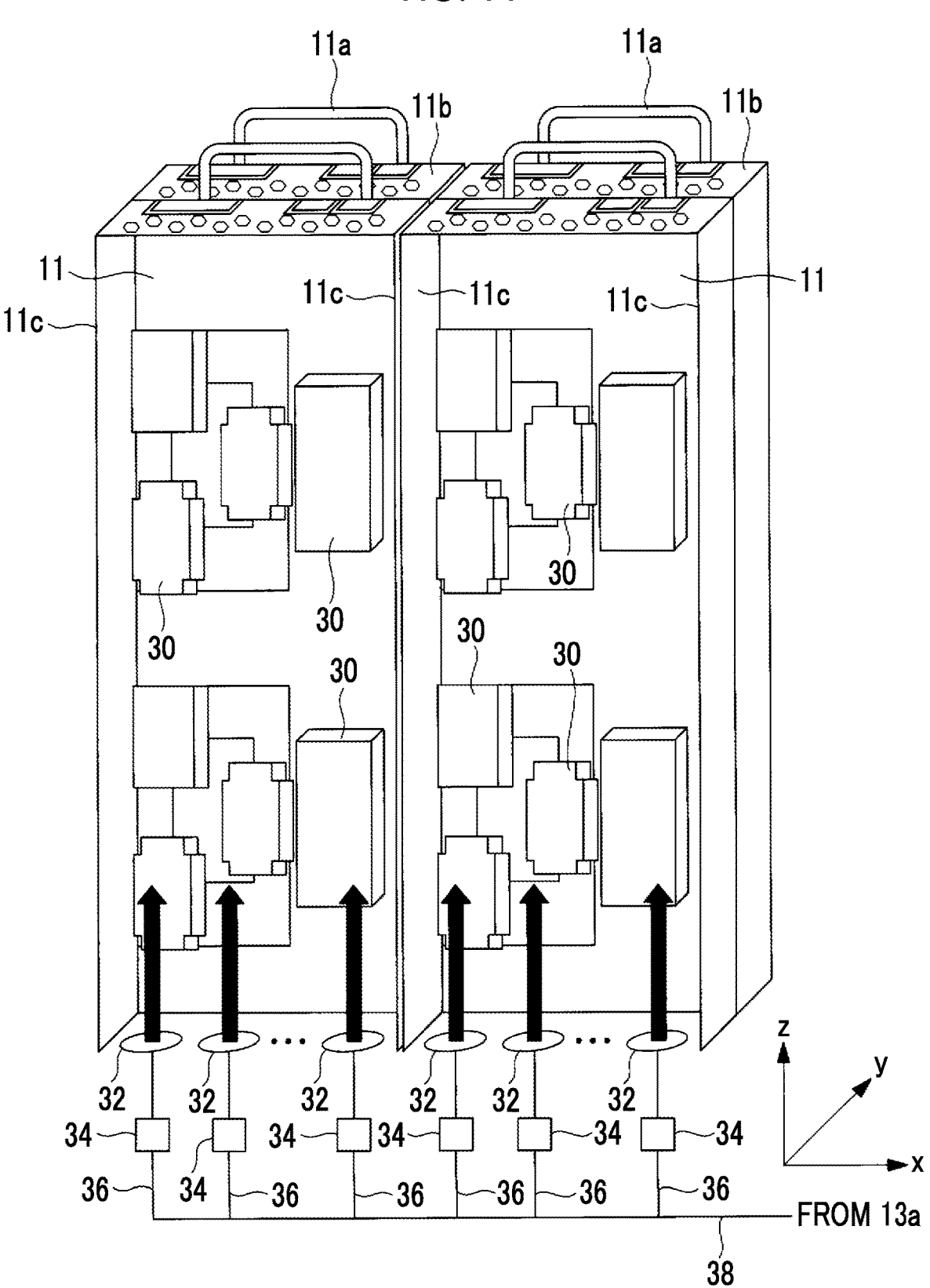
FIG. 11 is a perspective view illustrating a flow of a liquid coolant with respect to each substrate in an immersion cooling system according to a third embodiment of the present disclosure.

Next, a third embodiment of the present disclosure will be described. The third embodiment is different in the following points. As illustrated in FIG. 11, in addition to configuration of the first embodiment, a flow rate adjustment unit 34 is provided for each nozzle 32, and as illustrated in FIG. 12, a system control device 40b includes a nozzle flow rate control unit 55.

In the following description, configurations different from those of the first embodiment will be mainly described. The same reference numerals will be assigned to common items, and description thereof will be omitted.

As illustrated in FIG. 11, in the immersion cooling system 1 according to the present embodiment, the flow rate adjustment unit 34 is provided in each nozzle 32. The flow rate adjustment unit 34 adjusts a flow rate of the liquid coolant Lq discharged from the nozzle 32. An example of the flow rate adjustment unit 34 is a flow rate adjustment valve. The flow rate adjustment unit 34 is controlled by the system control device 40b.

Figure 12:
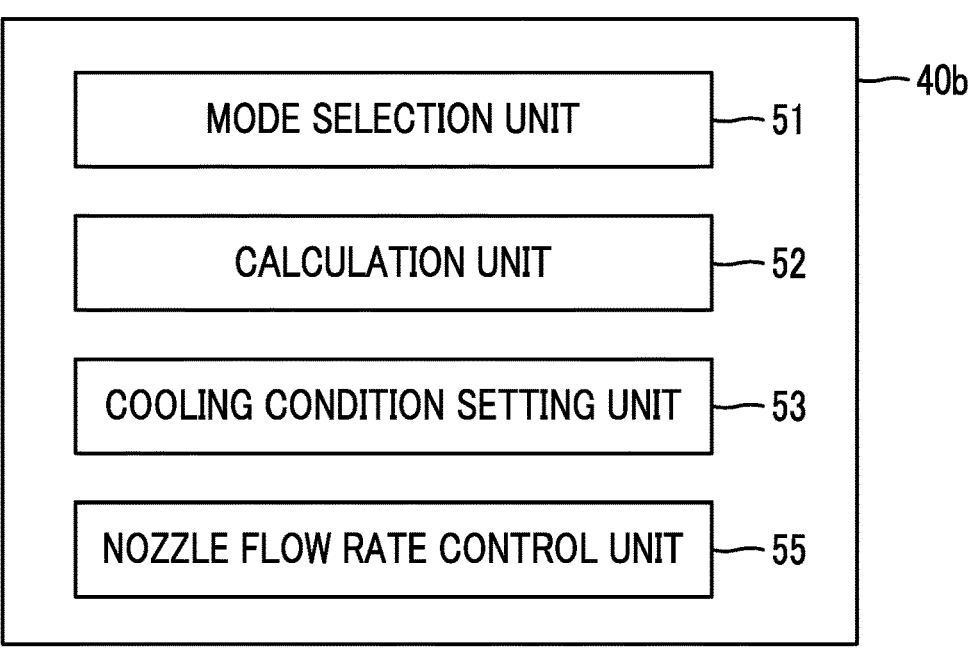
FIG. 12 is a functional block diagram illustrating an example of a function provided in a system control device according to the third embodiment of the present disclosure.

FIG. 12 is a functional block diagram illustrating an example of a function provided in the system control device 40b according to the present embodiment. As illustrated in FIG. 12, the system control device 40b includes the nozzle flow rate control unit 55.

For example, as illustrated in FIG. 9B, the nozzle flow rate control unit 55 controls the flow rate adjustment unit 34 so that the cooling efficiency becomes uniform when the cooling efficiency distribution varies. For example, the nozzle flow rate control unit 55 increases a valve opening degree of the flow rate adjustment unit 34 corresponding to a position where the cooling efficiency is lower than a predetermined value (for example, the average value), and increases the discharge amount of the liquid coolant. On the other hand, the nozzle flow rate control unit 55 decreases the discharge amount of the liquid coolant by squeezing the valve opening degree of the flow rate adjustment unit 34 corresponding to a position where the cooling effect is higher than the predetermined value. In this manner, the variations in the cooling efficiency in the immersion tank 3 can be reduced.

Instead of the above-described control, for example, the nozzle flow rate control unit 55 may control the valve opening degree of the flow rate adjustment unit 34 in accordance with a difference between the power consumption distribution and the cooling effect distribution inside the immersion tank 3.

A method for calculating the difference in the distributions is used as described in the second embodiment. In this way, the difference in the distributions at the position of each substrate 11 is calculated by comparing the power consumption distribution and the cooling effect distribution with each other, and the valve opening degree of the flow rate adjustment unit 34 is adjusted in accordance with the difference. For example, at a position where the cooling effect is relatively low but the power consumption is relatively large, the discharge amount of the liquid coolant is increased by opening the valve opening degree of the flow rate adjustment unit 34. In this manner, the difference between the power consumption and the cooling effect can be reduced. Similarly, for example, at a position where the cooling effect is relatively high but the power consumption is relatively small, the discharge amount of the liquid coolant is reduced by squeezing the valve opening degree of the flow rate adjustment unit 34. In this manner, the difference between the power consumption and the cooling effect can be reduced.

In this way, fine cooling control corresponding to the position can be performed by controlling the flow rate adjustment unit 34 provided corresponding to each nozzle.

As described in the second embodiment, the CPU load factor may be used instead of the power consumption.

Fourth Embodiment

Next, a fourth embodiment of the present disclosure will be described. In the first embodiment, the system control device 40 sets the target flow rate of the liquid coolant, the target flow rate of the cooling water, and the target temperature of the cooling water. In other words, the system control device 40 controls both the liquid coolant circulation unit 5 and the cooling unit 7. In contrast, the present embodiment is different from the first embodiment in the following point. The present embodiment includes a cooling unit control unit 60 that controls the cooling unit 7 and a liquid coolant circulation unit control unit 70 that controls the liquid coolant circulation unit 5.

In the following description, configurations different from those of the first embodiment will be mainly described. The same reference numerals will be assigned to common items, and description thereof will be omitted.

Figure 13:
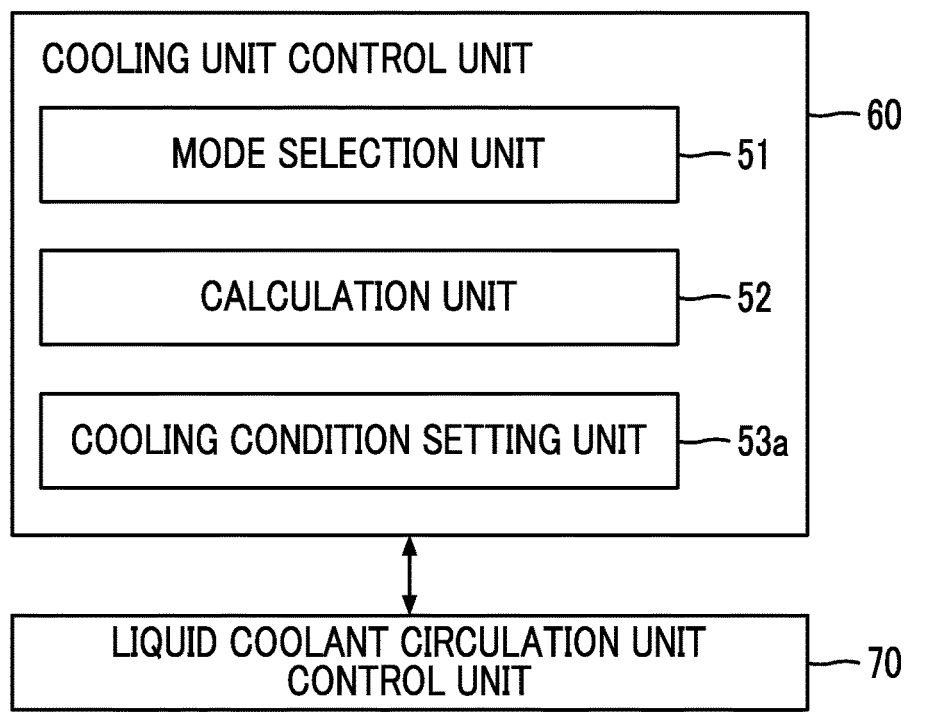
FIG. 13 is a functional block diagram illustrating an example of a function provided in a cooling unit control unit according to a fourth embodiment of the present disclosure.

FIG. 13 is a functional block diagram illustrating an example of a function provided in the cooling unit control unit 60. In the present embodiment, for example, the cooling unit 7 includes the cooling unit control unit 60. The liquid coolant circulation unit 5 includes the liquid coolant circulation unit control unit 70.

The cooling unit control unit 60 and the liquid coolant circulation unit control unit 70 may be configured to be capable of mutual communication. In this manner, for example, the cooling unit control unit 60 can acquire information relating to the flow rate of the liquid coolant from the liquid coolant circulation unit control unit 70.

Examples of the information relating to the flow rate of the liquid coolant include the target flow rate of the liquid coolant, a measurement value of the flow rate sensor of the liquid coolant, and the rotation speed or the frequency of the pump 19 that controls the flow rate of the liquid coolant. Hereinafter, a case where the target flow rate of the liquid coolant is used as the information relating to the flow rate of the liquid coolant will be described as an example. When the rotation speed or the frequency of the pump 19 is used as the information relating to the flow rate of the liquid coolant, the flow rate of the liquid coolant may be estimated from the rotation speed or the frequency of the pump 19.

In the present embodiment, the flow rate of the liquid coolant may be controlled to be constant.

For example, the cooling unit control unit 60 includes the mode selection unit 51, the calculation unit 52, and a cooling condition setting unit 53a. The cooling condition setting unit 53a sets the target temperature of the cooling water and the target flow rate of the cooling water, based on a cooling mode selected by the mode selection unit 51 and the required cooling amount calculated by the calculation unit 52.

For example, when the normal mode is selected as the cooling mode, the cooling condition setting unit 53a sets the target temperature of the cooling water and the target flow rate of the cooling water, based on the required cooling amount and the target flow rate of the liquid coolant. For example, these can be set in such a manner that a value acquired from the liquid coolant circulation unit control unit 70 is used for the flow rate of the liquid coolant in various calculation methods described in the first embodiment. When the liquid coolant circulation unit control unit 70 controls the pump 19 to discharge a constant discharge amount, the target temperature and the target flow rate of the cooling water may be set by registering a control value (target flow rate) thereof in advance and by using the registered control value. In this case, communication with the liquid coolant circulation unit control unit 70 is unnecessary.

For example, when the performance priority mode is selected as the cooling mode, the cooling condition setting unit 53*a* sets the target temperature of the cooling water to a minimum temperature derived from the outside air condition. For example, the cooling condition setting unit 53*a* may set the target rotation speed of the fan 23 to a maximum rotation speed. Furthermore, the cooling condition setting unit 53 may also set the target flow rate of the cooling water to the maximum flow rate.

In this manner, when the performance priority mode is selected, the cooling unit 7 is controlled to obtain a maximum cooling effect derived from the outside air condition or an effect close to the maximum cooling effect.

When the energy saving priority mode is selected, the cooling condition setting unit 53*a* sets the target temperature of the cooling water, based on a predetermined temperature determined based on heat resistance characteristics of the electronic component forming the electronic device 30. Furthermore, the cooling condition setting unit 53*a* uses the target flow rate of the liquid coolant which is acquired from the liquid coolant circulation unit control unit 70 or the pre-registered target flow rate of the liquid coolant, and sets the target flow rate of the cooling water and the target rotation speed of the fan 23 which satisfy the set target temperature and the required cooling amount of the cooling water. In this case, the target flow rate of the cooling water and the target rotation speed of the fan 23 may be set so that power of the pump 28 and of the fan 23 is minimized. Optimizing the target flow rate of the cooling medium and the target rotation speed of the fan 23 can be realized by using a known optimization method.

The cooling condition setting unit 53*a* may sequentially set various target values to satisfy the required cooling amount, based on a predetermined order set in advance. For example, the predetermined order is an element order whose power reduction effect is high. For example, when the power reduction effect is higher in the order of the power of the fan 23 and the power of the pump 28, the target values may be set in this order.

The cooling conditions (for example, the target rotation speed of the pump 28 and the target rotation speed of the fan 23) set by the cooling condition setting unit 53*a* in this way are transmitted to a drive control unit (not illustrated) that drives the pump 28 and the fan 23 of the cooling unit 7. The pump 28 and the fan 23 are driven in accordance with the target value.

In this way, according to the present embodiment, the required cooling amount is calculated, based on the parameter relating to the operation state of the electronic device 30, and the cooling condition is set in view of the required cooling amount. The operation state of the electronic device 30 has a correlation with the calorific value of the electronic device 30. Therefore, the required cooling amount corresponding to the calorific value can be calculated by using the parameter relating to the operation state of the electronic device 30. In this manner, a proper cooling condition of the cooling unit 7 corresponding to the calorific value of the electronic device 30 can be set.

Furthermore, according to the present embodiment, the plurality of cooling modes are provided, and the cooling condition is set, based on the selected cooling mode and the required cooling amount. Therefore, the cooling unit 7 can be properly controlled in accordance with the mode.

For example, when the performance priority mode is selected as the cooling mode, the cooling condition of the cooling unit 7 is set to realize the maximum cooling effect derived from the outside air condition. In this manner, the cooling unit 7 can achieve maximum cooling capacity or cooling capacity close to the maximum cooling effect.

When the energy saving priority mode is selected as the cooling mode, the target temperature of the cooling water is set within a range not exceeding a predetermined temperature determined based on the maximum allowable temperature of the electronic component forming the electronic device 30. Furthermore, the cooling condition of the cooling unit 7 is set to satisfy the target temperature and the required cooling amount of the cooling water and to minimize the consumed power of the cooling unit 7. In this manner, all of the electronic devices 30 can be maintained to have the maximum allowable temperature or lower while the consumed power of the cooling unit 7 is suppressed.

In the fourth embodiment described above, the cooling unit control unit 60 may further include the correction unit 54. Since details of the correction unit 54 have been described in detail in the second embodiment, description thereof will be omitted here.

In the fourth embodiment, the cooling unit control unit 60 and the liquid coolant circulation unit control unit 70 may be realized by the same processing circuitry, or may be realized by different processing circuitries (in other words, different computers).

Fifth Embodiment

Next, a fifth embodiment of the present disclosure will be described. In the first embodiment, the system control device 40 sets the target flow rate of the liquid coolant, the target flow rate of the cooling water, and the target temperature of the cooling water. In other words, the system control device 40 controls both the liquid coolant circulation unit 5 and the cooling unit 7. In contrast, the present embodiment is different from the first embodiment in the following point. The present embodiment includes a cooling unit control unit 60*a* that controls the cooling unit 7 and a liquid coolant circulation unit control unit 70*a* that controls the liquid coolant circulation unit 5.

In the following description, configurations different from those of the first embodiment will be mainly described. The same reference numerals will be assigned to common items, and description thereof will be omitted.

Figure 14:
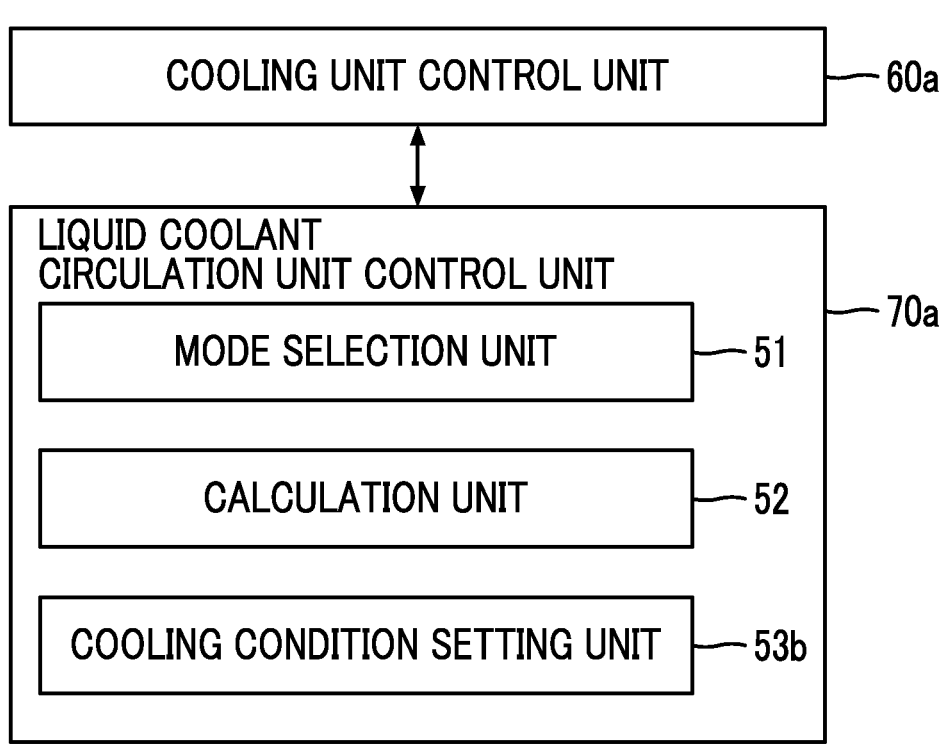
FIG. 14 is a functional block diagram illustrating an example of a function provided in a liquid coolant circulation unit control unit according to a fifth embodiment of the present disclosure.

FIG. 14 is a functional block diagram illustrating an example of a function provided in the liquid coolant circulation unit control unit 70*a*. In the present embodiment, for example, the cooling unit 7 includes the cooling unit control unit 60*a*. The liquid coolant circulation unit 5 includes the liquid coolant circulation unit control unit 70*a*.

The cooling unit control unit 60*a* and the liquid coolant circulation unit control unit 70*a* may be configured to be capable of mutual communication. In this manner, for example, the liquid coolant circulation unit control unit 70*a* can acquire information relating to the temperature and the flow rate of the cooling water from the cooling unit control unit 60*a*.

For example, the liquid coolant circulation unit control unit 70*a* includes the mode selection unit 51, the calculation unit 52, and a cooling condition setting unit 53*b*. The cooling condition setting unit 53*b* sets the target flow rate of the liquid coolant, based on the cooling mode selected by the mode selection unit 51 and the required cooling amount calculated by the calculation unit 52.

For example, when the normal mode is selected as the cooling mode, the cooling condition setting unit 53b sets the target flow rate of the liquid coolant, based on the required cooling amount calculated by the calculation unit 52, the inlet temperature of the liquid coolant flowing into the heat exchanger 17, and the outlet temperature of the liquid coolant fed from the heat exchanger 17.

For example, the cooling amount is expressed by the following equation.

$$\text{Cooling Amount} = (\text{Inlet Temperature of Liquid Coolant Outlet Temperature of Liquid Coolant}) \times \text{Liquid Coolant Flow Rate} \tag{2}$$

The cooling condition setting unit 53b calculates the liquid coolant flow rate by substituting the required cooling amount into the cooling amount and the temperature sensor measurement value into the inlet temperature of the liquid coolant and the outlet temperature of the liquid coolant with respect to the equation (2) above. In this manner, the cooling condition setting unit 53b sets the calculated liquid coolant flow rate as the target flow rate.

For example, when the performance priority mode is selected as the cooling mode, the cooling condition setting unit 53b sets the target flow rate of the liquid coolant to the maximum flow rate. In this way, when the performance priority mode is selected, the liquid coolant circulation unit 5 is controlled to achieve the maximum cooling capacity by setting the target flow rate of the liquid coolant to the maximum flow rate.

When the energy saving priority mode is selected as the cooling mode, the cooling condition setting unit 53b sets the target temperature of the liquid coolant, based on a predetermined temperature determined based on heat resistance characteristics of the electronic component forming the electronic device 30, and sets the target flow rate of the liquid coolant to the minimum flow rate of the liquid coolant which satisfies the required cooling amount.

Here, for example, description of the "predetermined temperature" means the lowest allowable maximum temperature or the temperature having a predetermined tolerance in the allowable maximum temperature thereof in the allowable maximum temperature of the electronic component immersed in the immersion tank 3.

For example, in the equation (2) above, the cooling condition setting unit 53b calculates the liquid coolant flow rate for obtaining the required cooling amount by substituting the required cooling amount into the cooling amount, the measurement value of the temperature sensor into the inlet temperature of the cooling amount, and the "target temperature of the liquid coolant" into the outlet temperature of the liquid coolant, and sets the calculated liquid coolant flow rate as the target flow rate.

The cooling condition set by the cooling condition setting unit 53b in this way is transmitted to a drive control unit (not illustrated) that drives the pump 19 of the liquid coolant circulation unit 5, and the drive control of the pump 19 in accordance with the cooling condition is performed.

In this way, according to the present embodiment, the required cooling amount is calculated, based on the parameter relating to the operation state of the electronic device 30, and the cooling condition is set in view of the required cooling amount. The operation state of the electronic device 30 has a correlation with the calorific value of the electronic device 30. Therefore, the required cooling amount corresponding to the calorific value can be calculated by using the parameter relating to the operation state of the electronic device 30. In this manner, a proper cooling condition of the liquid coolant circulation unit 5 corresponding to the calorific value of the electronic device 30 can be set.

Furthermore, according to the present embodiment, the plurality of cooling modes are provided, and the cooling condition is set, based on the selected cooling mode and the required cooling amount. Therefore, the liquid coolant circulation unit 5 can be properly controlled in accordance with the mode.

For example, when the performance priority mode is selected as the cooling mode, the target flow rate of the liquid coolant is set to the maximum flow rate. In this manner, the maximum cooling capacity of the liquid coolant circulation unit 5 can be achieved.

When the energy saving priority mode is selected as the cooling mode, a feeding temperature of the liquid coolant is set, based on a predetermined temperature determined based on heat resistance characteristics of the electronic component forming the electronic device 30, and the target flow rate of the liquid coolant is set to the minimum flow rate of the liquid coolant which satisfies the required cooling amount. In this manner, all of the electronic devices 30 can be maintained to have the maximum allowable temperature or lower while the consumed power of the liquid coolant circulation unit 5 is suppressed.

In the fifth embodiment described above, the liquid coolant circulation unit control unit 70a may further include the correction unit 54. Since details of the correction unit 54 have been described in detail in the second embodiment, description thereof will be omitted here.

In the fifth embodiment, the cooling unit control unit 60a and the liquid coolant circulation unit control unit 70a may be realized by the same processing circuitry, or may be realized by different processing circuitries (in other words, different computers).

In the fifth embodiment described above, the liquid coolant circulation system 6 includes the cooling unit 7. However, the cooling unit 7 may be omitted. In this case, the heat exchanger 17 in the liquid coolant circulation unit 5 is an air cooling type heat exchanger that exchanges the heat with the outside air. Even in this case, the control of the liquid coolant circulation unit control unit 70a is performed as described above.

In the fifth embodiment described above, the outlet temperature of the liquid coolant fed from the heat exchanger 17 is measured by the temperature sensor, and the target flow rate of the liquid coolant is set by using the measurement value. However, the present disclosure is not limited thereto. For example, when the cooling unit control unit 60a and the liquid coolant circulation unit control unit 70a are configured to be capable of communicating with each other, the target temperature and the target flow rate of the cooling water may be acquired from the cooling unit control unit 60a, and the outlet temperature of the liquid coolant may be estimated by using the acquired information. In this way, by estimating the outlet temperature of the liquid coolant, the temperature sensor that measures the outlet temperature of the liquid coolant can be omitted.

Hitherto, the present disclosure has been described with reference to the respective embodiments. However, the technical scope of the present disclosure is not limited to the scope described in the above-described embodiments. Various modifications or improvements can be added to the above-described embodiments within the scope not departing from the concept of the disclosure, and forms to which the modifications or the improvements are added are also included in the technical scope of the present disclosure. The above-described embodiments may be appropriately combined.

The processing procedures illustrated in FIGS. 6 and 7 are also examples, and unnecessary steps may be appropriately deleted, new steps may be added, or processing orders may be changed.

In each of the above-described embodiments, a case where the flow rate of the liquid coolant is controlled by the pump 19 and the flow rate of the cooling water is controlled by the pump 28 has been described as an example. However, the control of the flow rate of the liquid coolant and the cooling water is not limited thereto. For example, the discharge amount of the pump 19 may be constant, in other words, the pump 19 may be a fixed-speed pump, and a flow rate adjustment unit for adjusting the flow rate may be provided in the liquid coolant circulation path. Similarly, the discharge amount of the pump 28 may be constant, in other words, the pump 28 may be a fixed-speed pump, and a flow rate adjustment unit for adjusting the flow rate may be provided in the cooling water circulation path. An example of the flow rate adjustment unit is a flow rate adjustment valve.

In each of the above-described embodiments, a case where the cooling water is used as the cooling medium that exchanges the heat with the liquid coolant has been described as an example. However, the present disclosure is not limited to this example. A liquid other than water can also be used as the cooling medium.

In each of the above-described embodiments, for example, an aspect in which the cooling unit 7 directly cools the cooling water by using the outside air drawn in by the fan 23 has been described as an example. However, the present disclosure is not limited to this example. For example, the cooling unit 7 may include a configuration in which a chiller as a cooling part cools the cooling water by using a refrigerant such as water. In this case, the cooling condition setting unit according to each embodiment may set the parameter for controlling the cooling part. More specifically, the cooling condition setting unit sets a circulation amount of the refrigerant for cooling the cooling water, instead of the rotation speed of the fan 23.

In the second embodiment described above, when the system control device includes the correction unit 54, the mode selection unit 51 can be omitted. In this case, the cooling condition is set in accordance with the control when the cooling mode is set to the normal mode.

In each of the above-described embodiments, the temperature and the flow rate of the liquid coolant are controlled in accordance with the operation state of the electronic device 30. However, alternatively, for example, the calculation job assigned to the electronic device 30 may be controlled in accordance with the cooling state. For example, as illustrated in FIG. 9B, when the cooling efficiency varies depending on the position, a calculation job having a high calculation load may be assigned to the substrate 11 (server) disposed at the position having high cooling efficiency, and a calculation job having a low calculation load may be assigned to the substrate 11 (server) disposed at a position having low cooling efficiency.

The liquid coolant circulation unit, the control method therefor, and the program which are described in each of the embodiments described above are understood as follows, for example.

According to one aspect of the present disclosure, there is provided the liquid coolant circulation unit (5) that circulates the liquid coolant to the immersion tank (3) for cooling the plurality of electronic devices (30) by immersing the plurality of electronic devices in the liquid coolant. The liquid coolant circulation unit includes the flow rate adjustment unit (19) provided in the liquid coolant circulation path for circulating the liquid coolant to the immersion tank, the heat exchanger (17) provided in the liquid coolant circulation path and exchanging the heat between the liquid coolant and the cooling medium, and the liquid coolant circulation unit control unit (70a). The liquid coolant circulation unit control unit includes the mode selection unit (51) that selects any one of the plurality of cooling modes, the calculation unit (52) that calculates the required cooling amount, based on the parameters relating to the operation states of the plurality of electronic devices, and the cooling condition setting unit (53b) that sets the target value of the parameter relating to the flow rate of the liquid coolant, based on the selected cooling mode and the required cooling amount.

In this way, the required cooling amount is calculated, based on the parameter relating to the operation state of the electronic device, and the cooling condition is set in view of the required cooling amount. The operation state of the electronic device has a correlation with the calorific value of the electronic device. Therefore, the required cooling amount corresponding to the calorific value can be calculated by using the parameter relating to the operation state of the electronic device. In this manner, a proper cooling condition of the liquid coolant circulation unit corresponding to the calorific value of the electronic device can be set.

Furthermore, the plurality of cooling modes are provided, and the cooling condition is set, based on the selected cooling mode and the required cooling amount. Therefore, proper cooling corresponding to a desired mode can be performed.

In the liquid coolant circulation unit (5) according to one aspect of the present disclosure, the plurality of cooling modes may include the performance priority mode that prioritizes the performance of the electronic device, and when the performance priority mode is selected, the cooling condition setting unit may set the target flow rate of the liquid coolant to the maximum flow rate.

In this manner, the liquid coolant circulation unit can achieve the maximum cooling capacity or the cooling capacity close to the maximum cooling effect.

In the liquid coolant circulation unit (5) according to one aspect of the present disclosure, the plurality of cooling modes may include the energy saving priority mode that prioritizes the power usage efficiency, and when the energy saving priority mode is selected, the cooling condition setting unit may set the feeding temperature of the liquid coolant to be fed to the immersion tank, based on a predetermined temperature determined based on the heat resistance characteristics of the electronic component forming the electronic device, and may set the target flow rate of the liquid coolant to the minimum flow rate of the liquid coolant which satisfies the required cooling amount.

In this manner, all of the electronic devices can be maintained to have the maximum allowable temperature or lower while the consumed power of the liquid coolant circulation unit is suppressed.

In the liquid coolant circulation unit (5) according to one aspect of the present disclosure, the liquid coolant circulation unit control unit may include the correction unit that corrects the required cooling amount, based on a deviation between the distribution of the parameters indicating the operation states with respect to a disposition of the plurality of electronic devices inside the immersion tank and the cooling efficiency distribution inside the immersion tank, and the cooling condition setting unit may set the target value of the parameter relating to the flow rate of the liquid coolant, based on the selected cooling mode and the corrected required cooling amount.

The parameter indicating the operation state of the electronic device has a correlation with the calorific value of the electronic device. Therefore, the distribution of the parameter and the cooling effect distribution are compared with each other, and the required cooling amount is corrected, based on the deviation therebetween. In this manner, a proper cooling condition can be set in view of the variations in the calorific value and the variations in the cooling efficiency of the electronic devices inside the immersion tank.

In the liquid coolant circulation unit (5) according to one aspect of the present disclosure, the correction unit may correct the required cooling amount, based on a deviation between the power consumption distribution with respect to the disposition of the plurality of electronic devices inside the immersion tank and the cooling efficiency distribution inside the immersion tank.

The power consumption has a correlation with the calorific value of the electronic device. Therefore, the power consumption distribution and the cooling effect distribution are compared with each other, and the required cooling amount is corrected, based on the deviation therebetween. In this manner, a proper cooling condition can be set in view of the variations in the calorific value and the variations in the cooling efficiency of the electronic devices inside the immersion tank.

In the liquid coolant circulation unit (5) according to one aspect of the present disclosure, the correction unit may correct the required cooling amount, based on a deviation amount between the power consumption distribution with respect to the disposition of the plurality of electronic devices inside the immersion tank and the cooling efficiency distribution inside the immersion tank, and on the average value of the power consumption of the plurality of electronic devices.

In this manner, the required cooling amount can be corrected in view of not only the deviation amount between the power consumption distribution with respect to the disposition of the plurality of electronic devices inside the immersion tank and the cooling efficiency distribution inside the immersion tank, but also the average power consumption of the plurality of electronic devices inside the immersion tank.

In the liquid coolant circulation unit (5) according to one aspect of the present disclosure, the correction unit may correct the required cooling amount, based on a deviation between the calculation load distribution with respect to the disposition of the plurality of electronic devices inside the immersion tank and the cooling efficiency distribution inside the immersion tank.

The calculation load of the electronic device has a correlation with the calorific value of the electronic device. Therefore, the calculation load distribution and the cooling effect distribution are compared with each other, and the required cooling amount is corrected, based on the deviation therebetween. In this manner, a proper cooling condition can be set in view of the variations in the calorific value and the variations in the cooling efficiency of the electronic devices inside the immersion tank.

In the liquid coolant circulation unit (5) according to one aspect of the present disclosure, the correction unit may correct the required cooling amount, based on a deviation amount between the calculation load distribution with respect to the disposition of the plurality of electronic devices inside the immersion tank and the cooling efficiency distribution inside the immersion tank, and on the average value of calculation loads of the plurality of electronic devices.

In this manner, the required cooling amount can be corrected in view of not only the deviation amount between the calculation load distribution with respect to the disposition of the plurality of electronic devices inside the immersion tank and the cooling efficiency distribution inside the immersion tank, but also the average calculation load factor of the plurality of electronic devices inside the immersion tank.

Here, examples of the "calculation load" include a calculation load factor and a CPU load factor.

In the liquid coolant circulation unit (5) according to one aspect of the present disclosure, the calculation load distribution may be estimated, based on the parameter relating to the execution status of the calculation job assigned to the plurality of electronic devices.

The correction amount is calculated by using the calculation load distribution obtained from the calculation job. In this manner, the cooling condition can be set in view of the operation state of the electronic device in the future.

According to one aspect of the present disclosure, there is provided a control method for the liquid coolant circulation unit (5) that circulates the liquid coolant to the immersion tank for cooling the plurality of electronic devices by immersing the plurality of electronic devices in the liquid coolant. The liquid coolant circulation unit includes the flow rate adjustment unit provided in the liquid coolant circulation path for circulating the liquid coolant to the immersion tank, and the heat exchanger provided in the liquid coolant circulation path and exchanging the heat between the liquid coolant and the cooling medium. The control method includes a step of selecting any one of the plurality of cooling modes, a step of calculating the required cooling amount, based on the parameters relating to the operation states of the plurality of electronic devices, and a step of setting the target value of the parameter relating to the flow rate of the liquid coolant, based on the selected cooling mode and the required cooling amount.

According to one aspect of the present disclosure, there is provided the program for causing the computer to function as the liquid coolant circulation unit control unit.

According to one aspect of the present disclosure, there is provided the immersion cooling system (1) including the liquid coolant circulation unit (5) and the immersion tank (3).

REFERENCE SIGNS LIST

1: Immersion cooling system
3: Immersion tank
5: Liquid coolant circulation unit
6: Liquid coolant circulation system
7: Cooling unit
11: Substrate
13: Liquid feeding pipe
15: Liquid return pipe
17: Heat exchanger
19: Pump
21: Liquid coolant discharge pipe
23: Fan
25: Cooling water supply pipe
26: Cooling water return pipe
28: Pump 30: Electronic device
32: Nozzle
34: Flow rate adjustment unit
40: System control device
40a: System control device
40b: System control device
41: CPU
42: Main memory
43: Storage unit
45: Communication unit
46: Input unit
47: Display unit
51: Mode selection unit
52: Calculation unit
53: Cooling condition setting unit
53a: Cooling condition setting unit
53b: Cooling condition setting unit
54: Correction unit
55: Nozzle flow rate control unit
60: Cooling unit control unit
60a: Cooling unit control unit
70: Liquid coolant circulation unit control unit
70a: Liquid coolant circulation unit control unit
Lq: Liquid coolant

The invention claimed is:

1. A liquid coolant circulation unit that circulates a liquid coolant to an immersion tank for cooling a plurality of electronic devices by immersing the plurality of electronic devices in the liquid coolant, the liquid coolant circulation unit comprising:

a flow rate adjustment unit provided in a liquid coolant circulation path for circulating the liquid coolant to the immersion tank;

a heat exchanger provided in the liquid coolant circulation path and exchanging heat between the liquid coolant and a cooling medium; and a liquid coolant circulation unit control unit, wherein the liquid coolant circulation unit control unit includes:

a mode selection unit that selects any one of a plurality of cooling modes;

a calculation unit that calculates a required cooling amount, based on parameters relating to operation states of the plurality of electronic devices; and a cooling condition setting unit that sets a target value of a parameter relating to a flow rate of the liquid coolant, based on the selected cooling mode and the required cooling amount, the liquid coolant circulation unit control unit includes a correction unit that corrects the required cooling amount, based on a deviation between a distribution of the parameters indicating the operation states with respect to a disposition of the plurality of electronic devices inside the immersion tank and a cooling efficiency distribution inside the immersion tank, and the cooling condition setting unit sets the target value of the parameter relating to the flow rate of the liquid coolant, based on the selected cooling mode and the corrected required cooling amount.

2. The liquid coolant circulation unit according to claim 1, wherein the correction unit corrects the required cooling amount, based on a deviation between a power consumption distribution with respect to the disposition of the plurality of electronic devices inside the immersion tank and the cooling efficiency distribution inside the immersion tank.

3. The liquid coolant circulation unit according to claim 1, wherein the correction unit corrects the required cooling amount, based on a deviation amount between a power consumption distribution with respect to the disposition of the plurality of electronic devices inside the immersion tank and the cooling efficiency distribution inside the immersion tank, and on an average value of power consumption of the plurality of electronic devices.

4. The liquid coolant circulation unit according to claim 1, wherein the correction unit corrects the required cooling amount, based on a deviation between a calculation load distribution with respect to the disposition of the plurality of electronic devices inside the immersion tank and the cooling efficiency distribution inside the immersion tank.

5. The liquid coolant circulation unit according to claim 1, wherein the correction unit corrects the required cooling amount, based on a deviation amount between a calculation load distribution with respect to the disposition of the plurality of electronic devices inside the immersion tank and the cooling efficiency distribution inside the immersion tank, and on an average value of calculation loads of the plurality of electronic devices.

6. The liquid coolant circulation unit according to claim 4, wherein the calculation load distribution is estimated, based on a parameter relating to an execution status of a calculation job assigned to the plurality of electronic devices.

7. The liquid coolant circulation unit according to claim 5, wherein the calculation load distribution is estimated, based on a parameter relating to an execution status of a calculation job assigned to the plurality of electronic devices.

* * * * *